United States Patent [19]

Mouri et al.

[11] Patent Number: 5,073,791

[45] Date of Patent: Dec. 17, 1991

[54] IMAGE FORMING DEVICE

[75] Inventors: Akihiro Mouri, Atsugi; Masato Katayama, Yokohama; Tetsuro Fukui, Kawasaki; Kazuo Isaka, Tokyo; Shoji Kikuchi, Yokohama; Noboru Koumura, Narashino, all of Japan

[73] Assignee: Canon Kabushiki Kaisha, Tokyo, Japan

[21] Appl. No.: 558,639

[22] Filed: Jul. 27, 1990

[30] Foreign Application Priority Data

Jul. 27, 1989 [JP] Japan ................... 1-196041

[51] Int. Cl.⁵ ............................. G03B 27/52
[52] U.S. Cl. ............................. 355/27
[58] Field of Search ............ 355/27, 28, 100, 106

[56] References Cited

U.S. PATENT DOCUMENTS

| 3,874,947 | 4/1975 | Hayakawa et al. | 96/51 |
|---|---|---|---|
| 4,021,240 | 5/1977 | Cerquone et al. | 96/29 D |
| 4,123,274 | 10/1978 | Knight et al. | 96/66 T |
| 4,220,709 | 9/1980 | de Mauriac | 430/353 |
| 4,624,910 | 11/1986 | Takeda | 430/203 |
| 4,629,676 | 3/1986 | Hayakawa et al. | 430/203 |
| 4,649,098 | 3/1987 | Takeda | 430/270 |
| 4,753,862 | 1/1988 | Sato et al. | 430/138 |
| 4,764,451 | 8/1988 | Ishikawa | 430/138 |
| 4,799,085 | 1/1989 | Nagumo et al. | 355/27 |
| 4,956,253 | 9/1990 | Nakamura | 430/138 |
| 5,001,032 | 3/1991 | Katayama et al. | 430/203 |

FOREIGN PATENT DOCUMENTS

| 0199596 | 10/1986 | European Pat. Off. . |
|---|---|---|
| 0202490 | 11/1986 | European Pat. Off. . |
| 0219087 | 4/1987 | European Pat. Off. . |
| 0232721 | 8/1987 | European Pat. Off. . |
| 0326424 | 8/1989 | European Pat. Off. . |
| 0328364 | 8/1989 | European Pat. Off. . |
| 0330504 | 8/1989 | European Pat. Off. . |
| 3207064 | 12/1982 | Fed. Rep. of Germany . |
| 45-018416 | 6/1970 | Japan . |
| 55-50246 | 4/1980 | Japan . |
| 58-115638 | 7/1980 | Japan . |
| 56-27132 | 12/1981 | Japan . |
| 58-118638 | 7/1983 | Japan . |
| 58-118639 | 7/1983 | Japan . |
| 58-192032 | 11/1983 | Japan . |
| 59-55429 | 3/1984 | Japan . |
| 61-75342 | 4/1986 | Japan . |
| 62-70836 | 4/1987 | Japan . |
| 2054884 | 2/1981 | United Kingdom . |

OTHER PUBLICATIONS

Shashinkogoku Nokiso, Higinen Hen (Basis of Photooptic, Non-Silver Version), p. 250.

Primary Examiner—L. T. Hix
Assistant Examiner—D. Rutledge
Attorney, Agent, or Firm—Fitzpatrick, Cella, Harper & Scinto

[57] ABSTRACT

This invention relates to an image forming device by use of dry process silver salt materials comprising a sheet-shaped photosensitive member having a monomer and a photopolymerization initiator on a substrate, a reducing agent, a photosensitive silver halide and an organic silver salt; a supply means of said photosensitive member; an irradiation means provided along the moving route of the photosensitive member in the order mentioned from its upstream side for irradiating a light information on said photosensitive member; a heat means for heating said photosensitive member, and a uniform exposure means for exposing uniformly said photosensitive member for forming a polymer image on said photosensitive member.

21 Claims, 22 Drawing Sheets

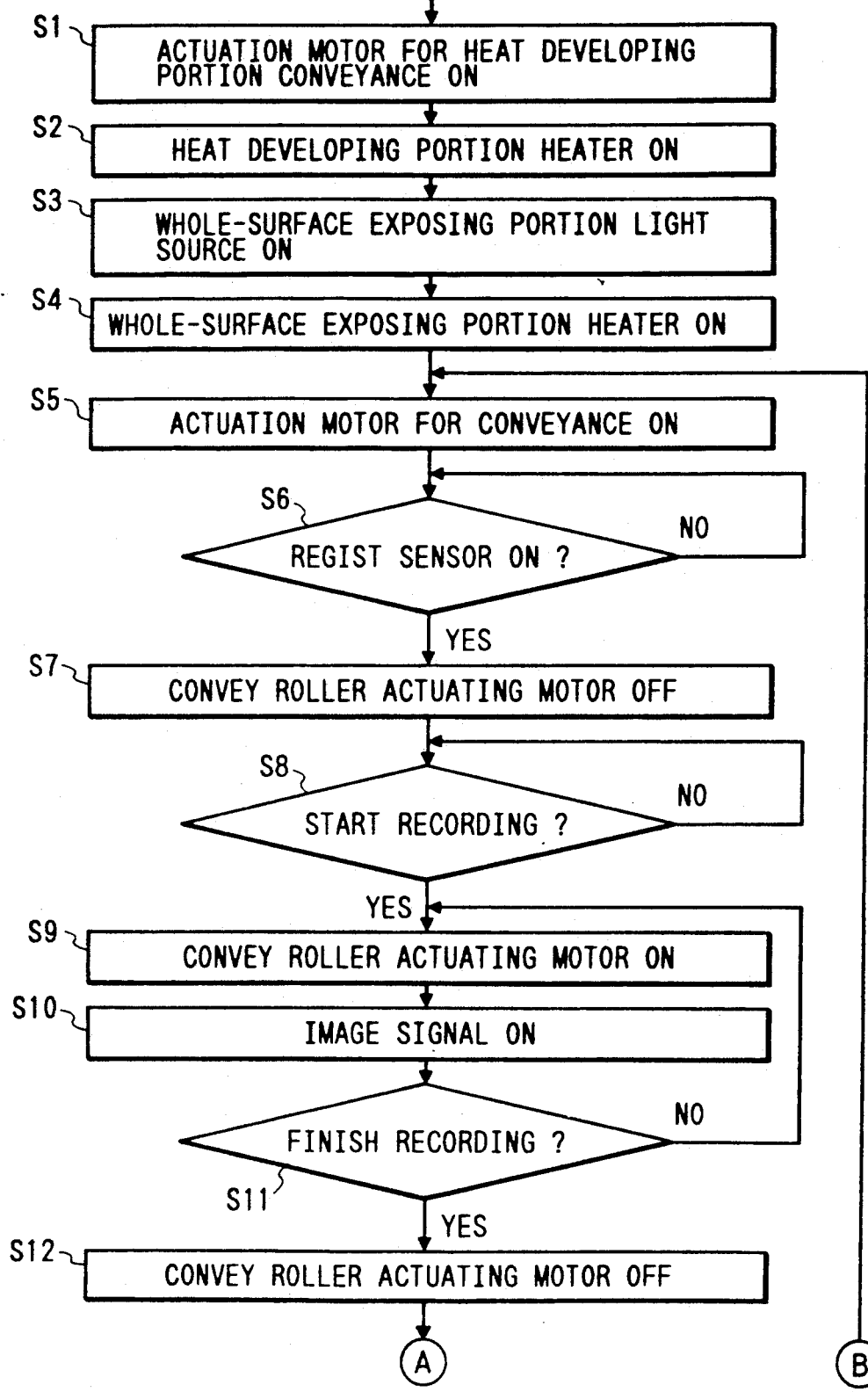

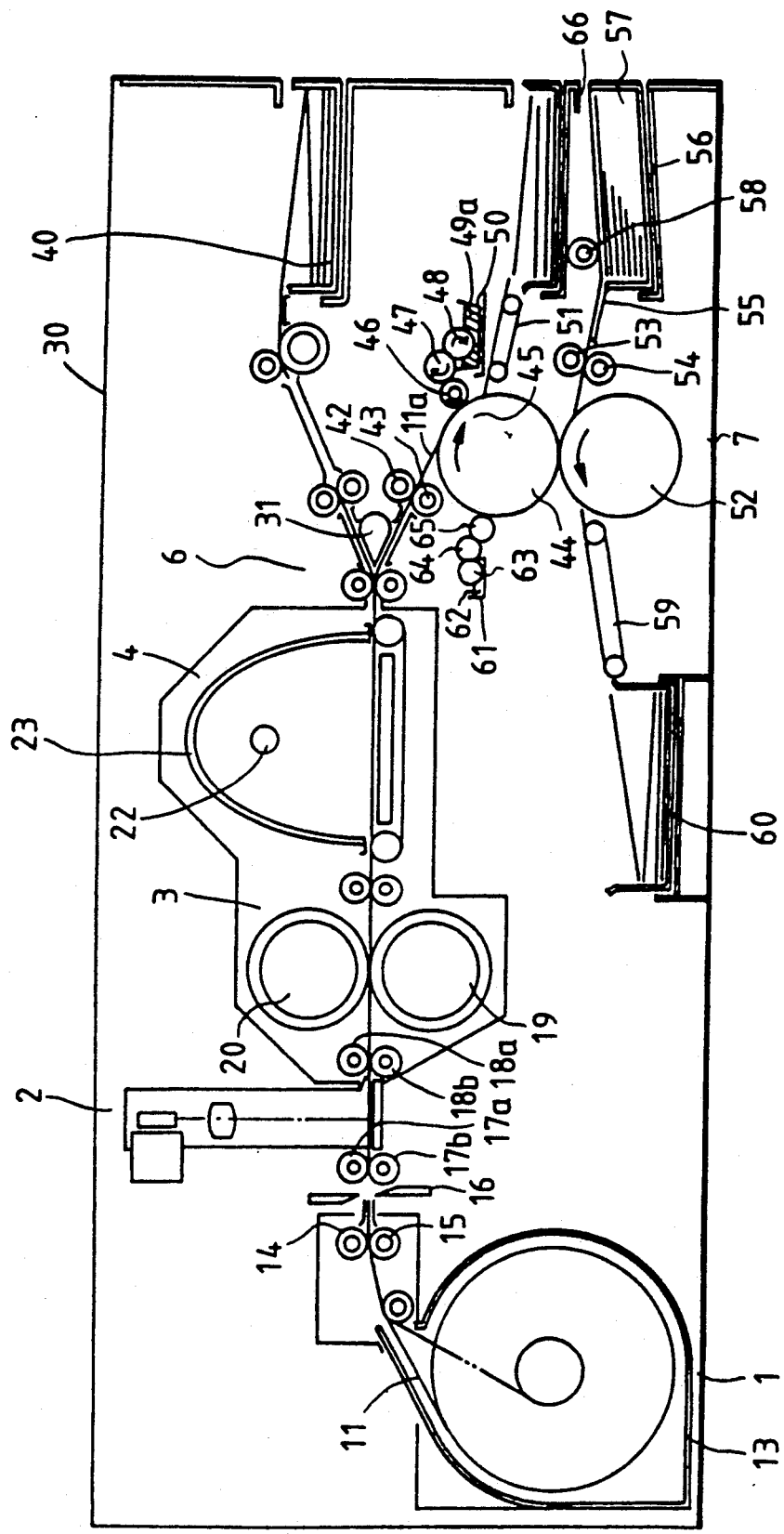

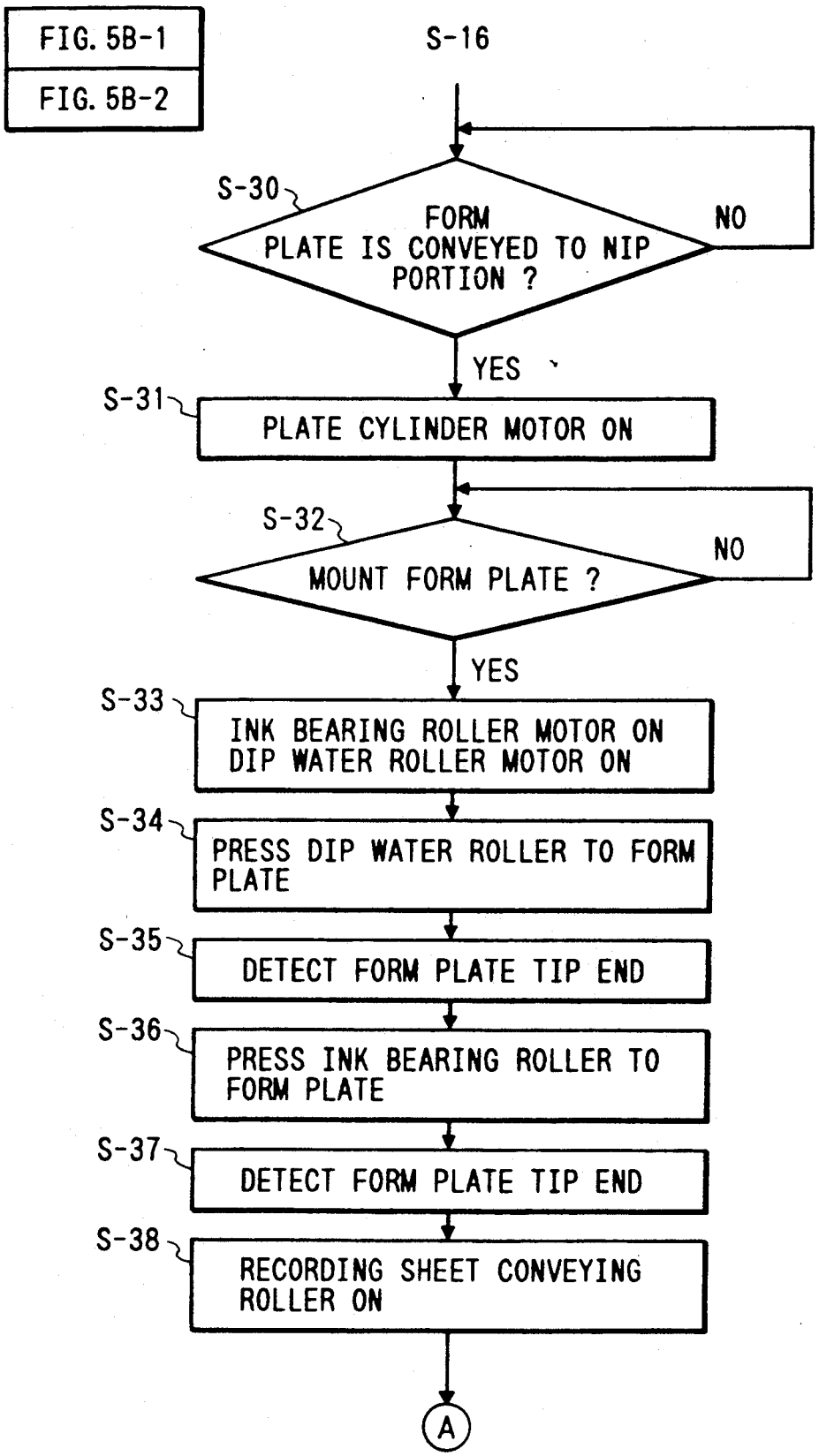

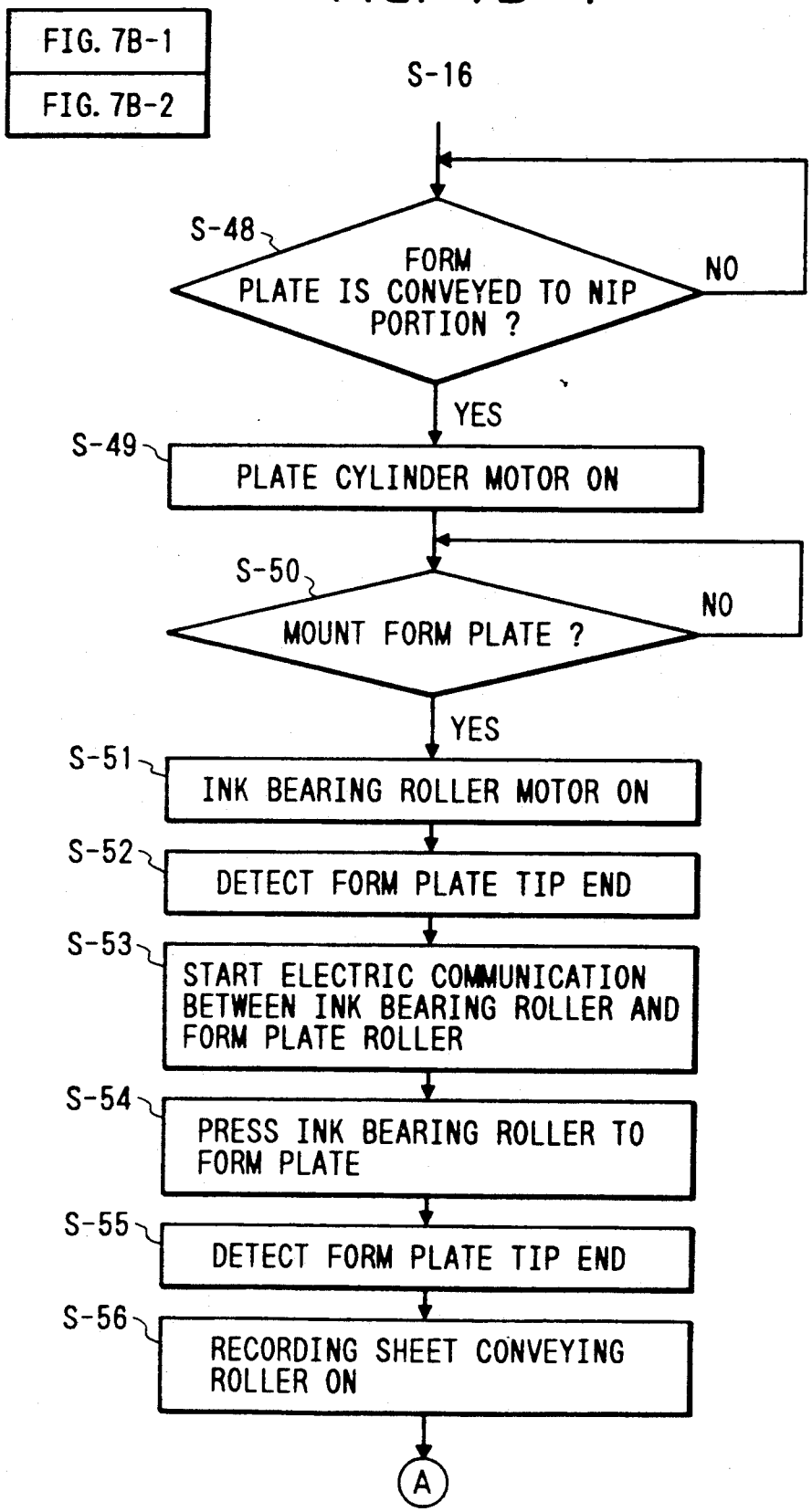

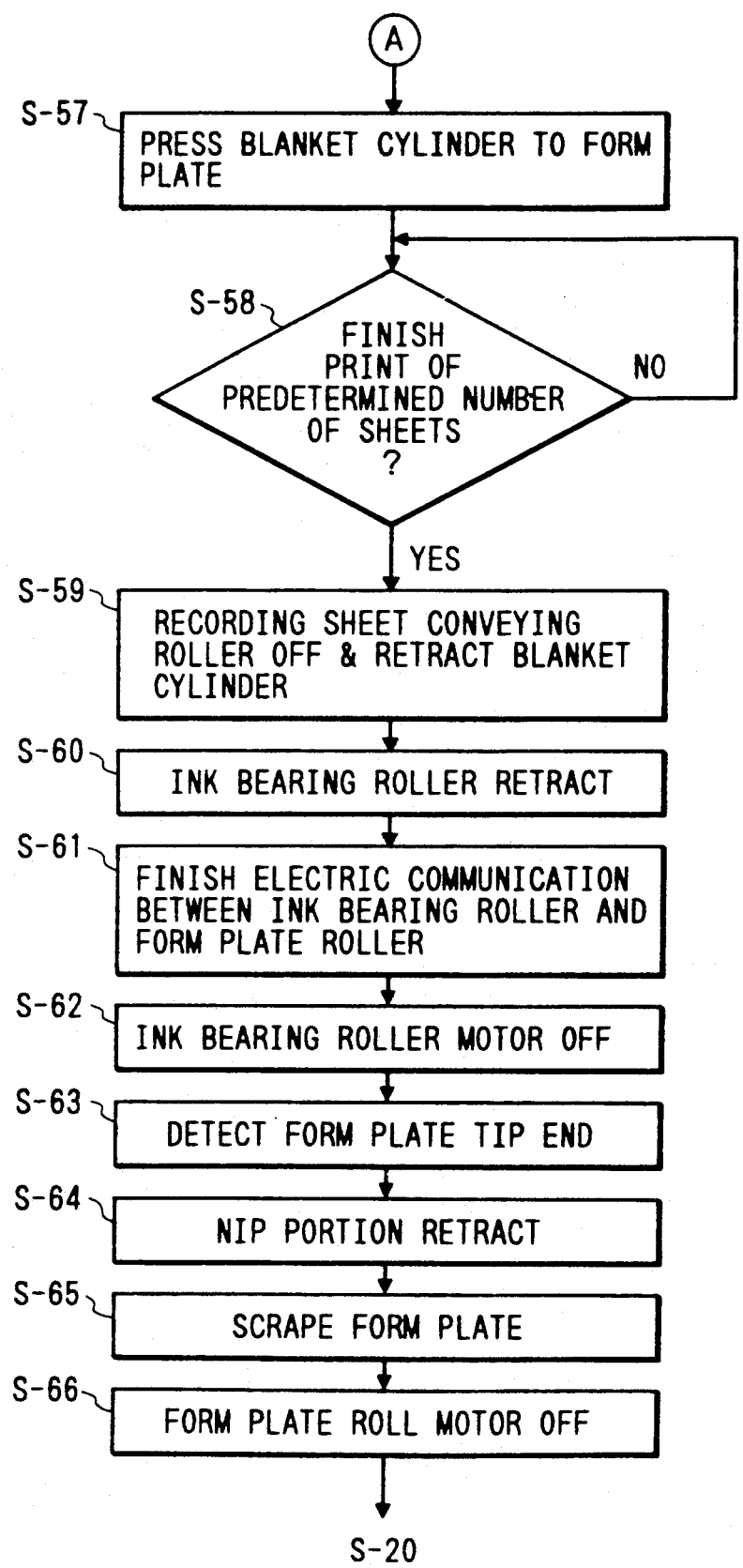

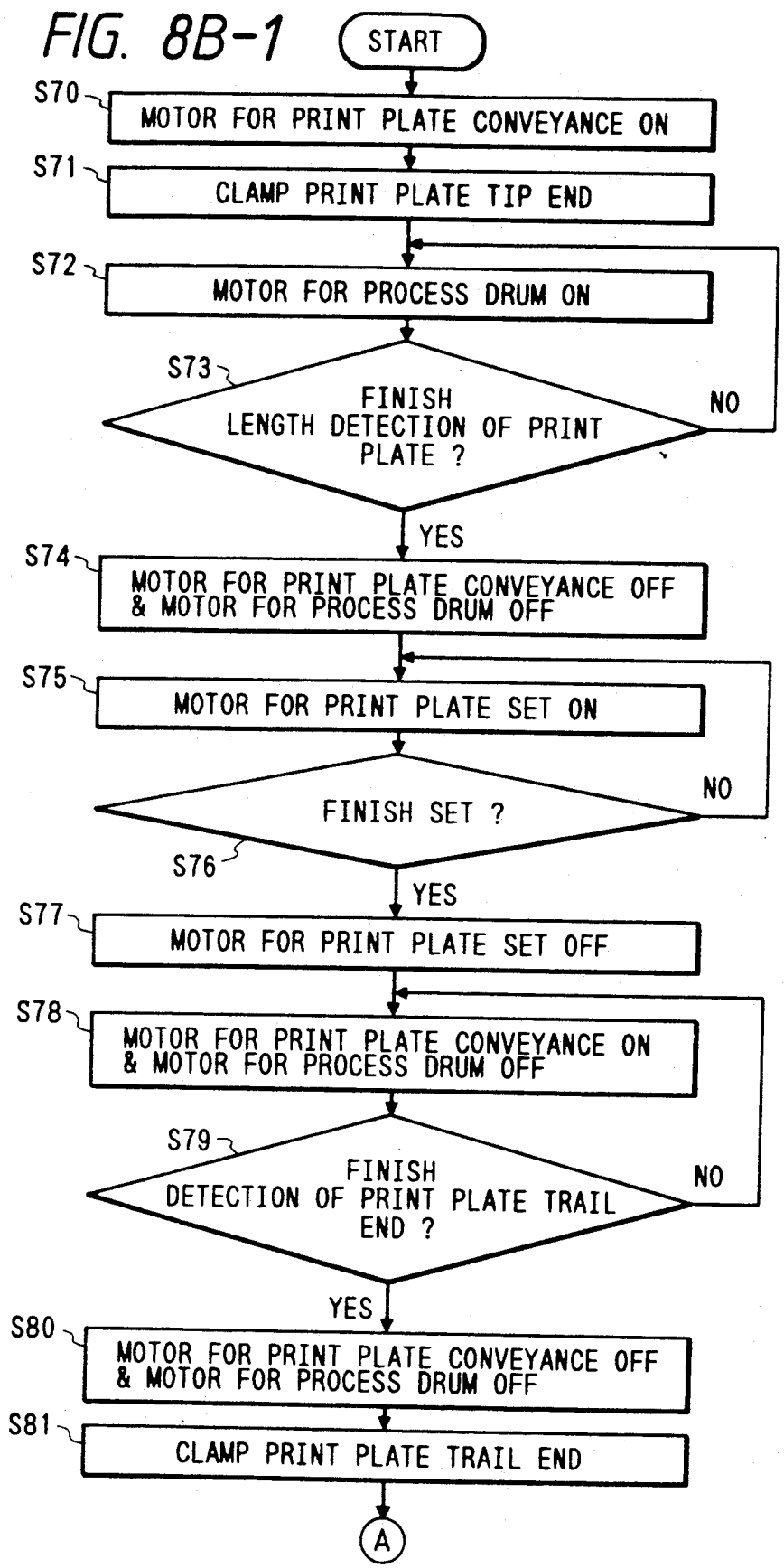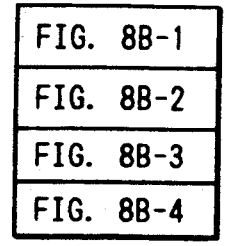

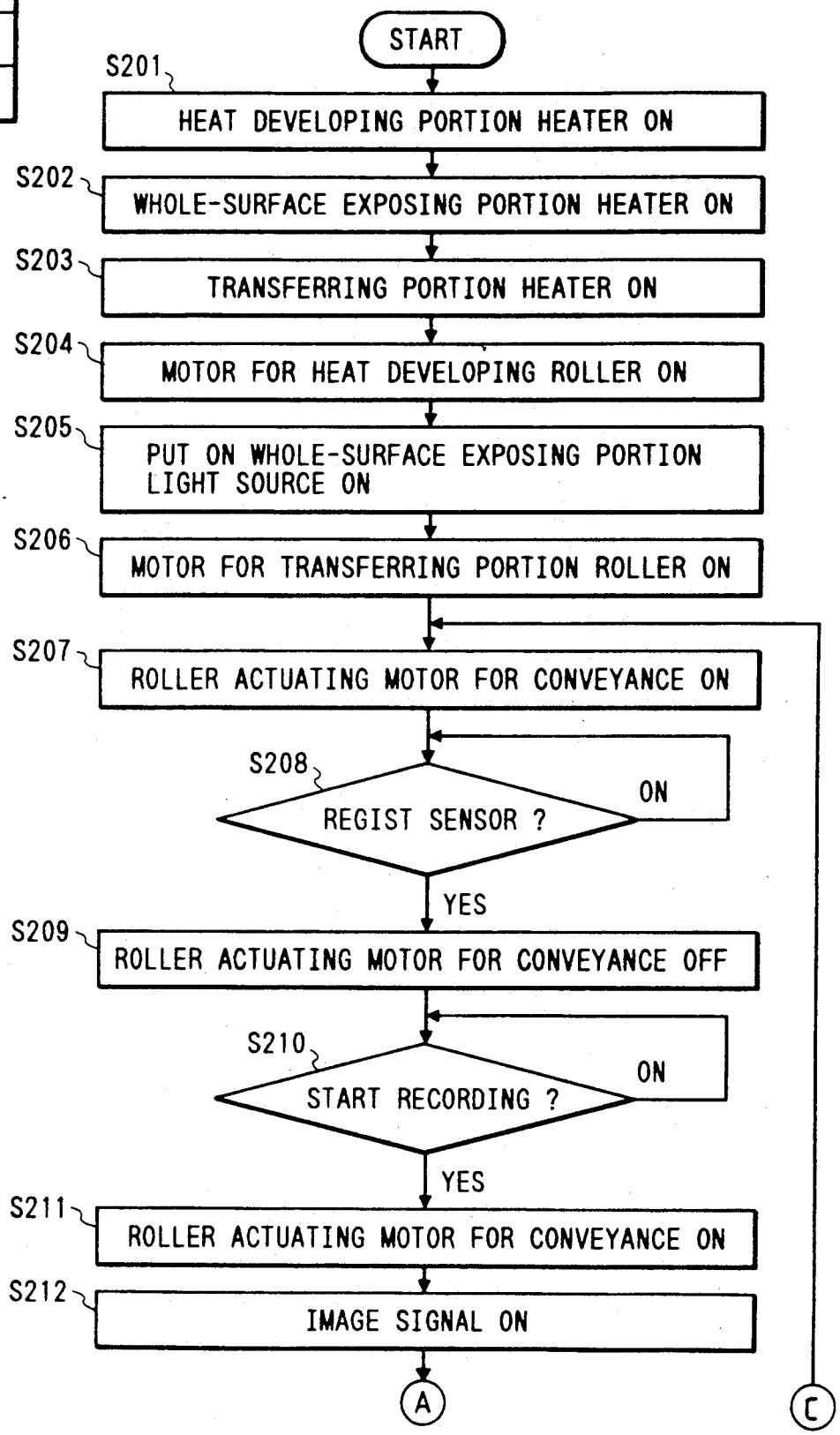

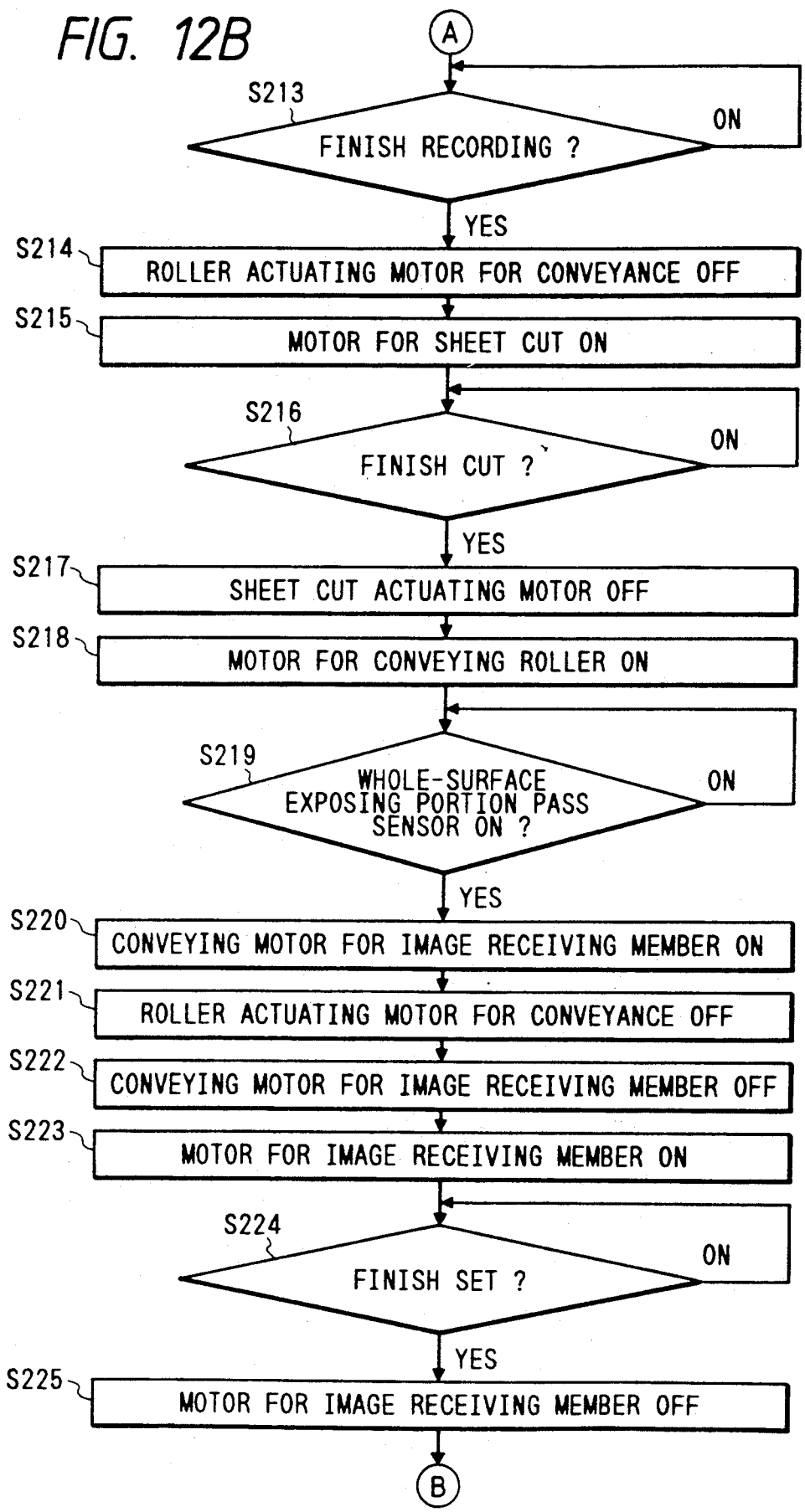

IMAGE FORMING DEVICE

BACKGROUND OF THE INVENTION

1. Filed of the Invention

This invention relates to a device for forming a polymer image by forming a portion comprising a polymer imagewise on a photosensitive member containing a polymerizable composition, and a device for forming a visible image from the above-mentioned polymer image.

2. Related Background Art

Polymer image is an important image for formation of a color image, because difference is created between the image portion and the non-image portion in such physical properties such as wettability, tackiness, etc. depending on the difference in polymerization degree, crosslinking degree, etc.

A large number of methods have been known for formation of polymer images. Generally speaking, by use of a mask of a silver salt or a metal for formation of a print plate, photoesist, etc., a polymer image is formed by photopolymerization by use of a light source with great light intensity such as mercury lamp, etc.

However, these methods which employ a silver salt or metal mask not only require complicated steps such as wet process treatment, etc., but also involve the drawback that the device will become a large scale when formed into an integrated type.

Various attempts have been made to simplify these methods to effect completely dry process treatments. For example, as described in Japanese Patent Application Laid-open Nos. 61-75342, 55-50246, and Japanese Patent Application No. 62-17155 (U.S. Ser. No. 302,270), a photosensitive material comprising at least a photosensitive silver halide, an organic silver salt, a reducing agent, a polymerization composition precursor, etc. is exposed and then subjected to the reaction by application of heat. By doing so, after the substances formed, disappeared or decomposed and endowed with polymerization inhibiting ability or light-shielding effect, polymerization and crosslinking reaction are caused to occur by light, thereby forming a polymer image.

As described above, attempts to form a polymer image by use of photopolymerization reaction are free from complicated reactions such as competitive reaction, etc. as in thermal polymerization reaction, because the steps involved do not permit a plurality of chemical reactions to proceed at the same time, but in other words, the respective steps are performed for the respective chemical reactions, whereby the respective conditions can be controlled easily. Also, there are such advantages that the resolution of the image itself is good and that the contrast is improved, etc.

SUMMARY OF THE INVENTION

An object of the present invention is to provide a device for forming a polymer image by use of photopolymerization reaction.

Another object of the present invention is to provide a device for forming the above polymer image at high image quality.

Still another object of the present invention is to provide a small scale image forming device which forms automatically the above polymer image.

The image forming device by use of dry process silver salt materials of the present invention which accomplishes the above objects has a sheet-shaped photosensitive member having a monomer and a photopolymerization initiator on a substrate, a reducing agent, a photosensitive silver halide and an organic silver salt; a supply means of said photosensitive member; and a irradiation means provided along the moving route of the photosensitive member in the order mentioned from its upstream side for irradiating a light information on said photosensitive member; a heating means for heating said photosensitive member; and an uniform exposure means for exposing uniformly said photosensitive member for forming a polymer image on said photosensitive member. This apparatus forms a polymer image by photopolymerization corresponding to the light information.

BRIEF DESCRIPTION OF THE DRAWINGS

FIG. 3, 3A, 3B is a flow chart for driving the device shown in FIG. 1.

FIG. 5A is a schematic sectional view showing another embodiment of the present invention, and FIG. 5B 5B-1, 5B-2 is a flow chart for driving the device shown in FIG. 5A.

FIG. 7B, 7B-1, 7B-2 is a flow chart for illustration of the actuation of the device of FIG. 7A.

FIG. 8B, 8B-1, 8B-2, 8B-3, 8B-4 is a flow chart for illustration of the actuation of the device of FIG. 8A.

FIG. 12, 12A, 12B, 12C is a flow chart for illustration of the actuation of the device of FIG. 10.

DETAILED DESCRIPTION OF THE PREFERRED EMBODIMENTS

An embodiment of the image forming device of the present invention is described below.

Figure 1:
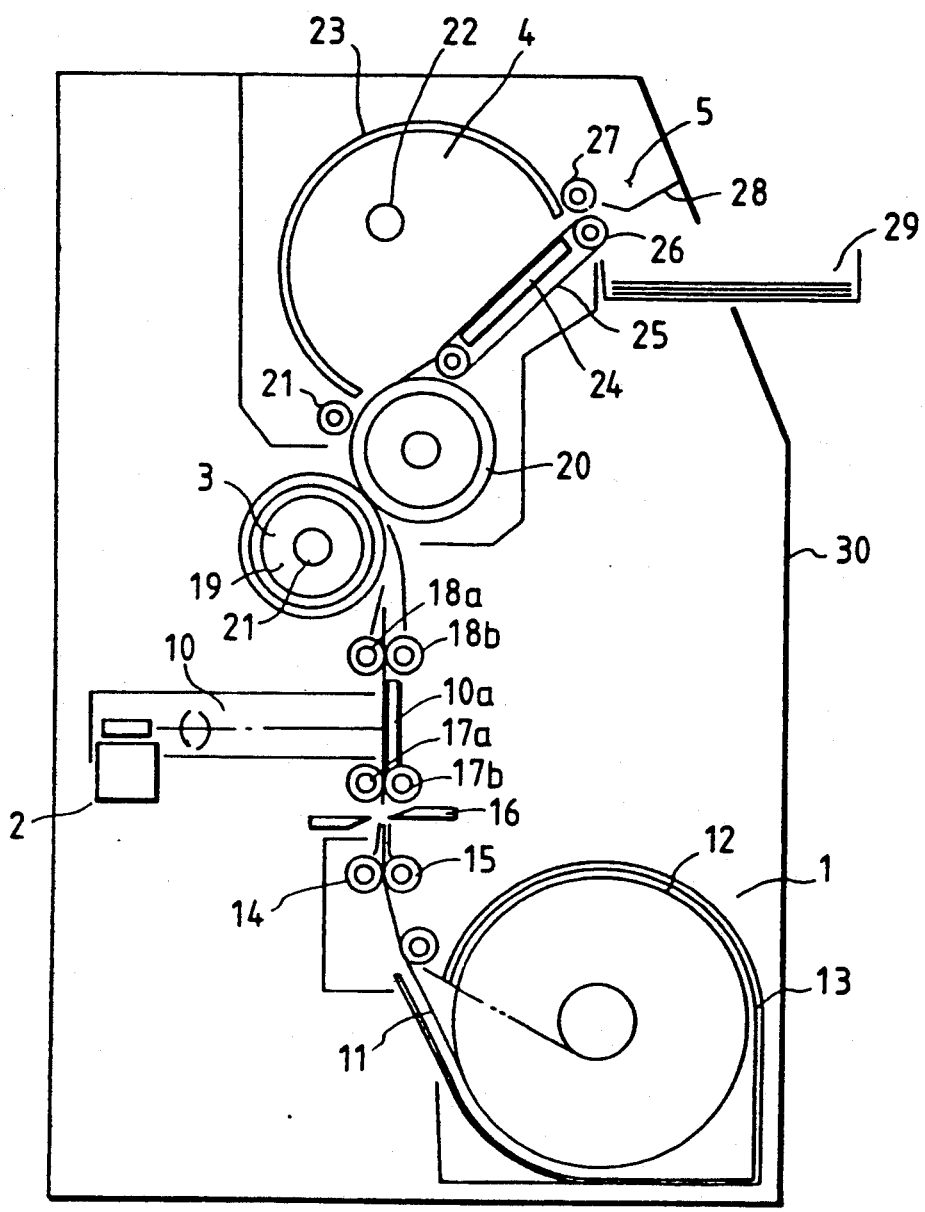
FIG. 1 is a schematic sectional view showing an embodiment of the present invention.

FIG. 1 is a schematic sectional view of the image forming device of the present invention. This image forming device consists primarily of a paper feeding portion 1, an image exposure portion 2, a heating developing portion 3, a whole-surface exposure portion 4, and a discharging portion 5.

In the following, the respective portions are described successively.

1) Paper feeding portion 1

In the paper feeding portion 1, a photosensitive cartridge 13 housing a sensitive material roll 12 as the photosensitive member having a photosensitive member 11 wound up is provided freely detachably. At the exit of the cartridge 13, a pair of delivery rollers 14, 15 are arranged, whereby the photosensitive member is delivered at a predetermined length. And, the photosensitive member delivered at a predetermined length is cut by a cutter unit 16.

2) Image exposure portion 2

The photosensitive member 11 conveyed from the paper feeding portion 1 is subjected to imagewise exposure by a laser exposure means 10. Numeral 10a is a support for photosensitive member 11 for the purpose of exposure.

3) Heating developing portion 3

The photosensitive member 11 subjected to imagewise exposure is delivered by the conveying rollers 18a, 18b to the heating developing portion 3, where it is subjected to heating development at 120° C. sandwiched between the heating roll 19 and the support 20. As the heat source, the heating roll 19 has a halogen heater 21 internally thereof.

4) Whole-surface exposure portion 4

The developed photosensitive member 11 is delivered by the conveying roller 21 to the whole-surface exposure portion 4. The whole-surface exposure portion 4 consists of a light source 22, a light source guide 23, a heating plate 24, and a convey belt 25.

5) Discharging portion 5

According to the steps as described above, the image forming member 11 is delivered by convey rollers 26, 27, and a convey guide 28 to a discharge tray 29. Numeral 30 is a casing of the device.

As the light source for image exposure in the above embodiment, one which can write corresponding to the image signals may be employed. Specific examples may include CRT, laser, LED, LED array as in various electrophotographic printers, or a combination of a shutter array such as LCD or PLZD (light-transmissive ceramic polycrystalline material), etc. with a linear light source such as fluorescent lamp, etc. or a plane light. Also, it is possible to write an original directly onto a photosensitive member as in electrophotographic copying machine by use of a reflection mirror.

In the above embodiment, the heat developing portion is heated by the heating roll having a halogen heater, but instead thereof, it is also possible to perform heating development by heating by combination of a heating plate, a belt and rollers, thermal heat heating, current passage heating, microwave, irradiation of IR-ray.

In the above embodiment, a roll-shaped photosensitive member is employed, but photosensitive members in shape of cut sheets may be also delivered successively.

Figure 2A:
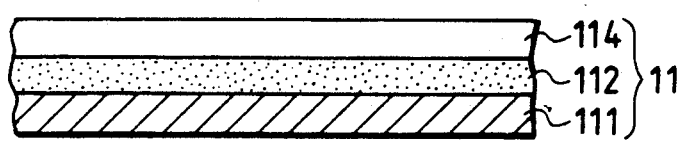
FIGS. 2A to 2C show one layer constitutional illustration of the image forming member to be used in the present invention.
Figure 2B:
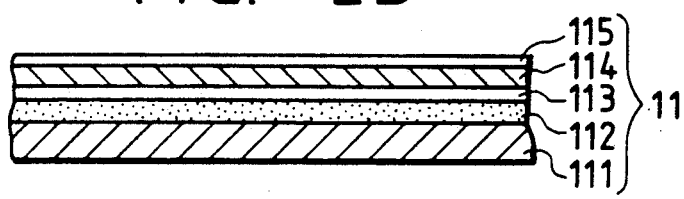
Figure 2C:
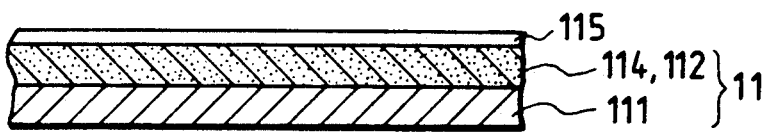

Next, referring to FIGS. 2A to 2C, the photosensitive member 11 is described in detail.

The photosensitive member 11 to be used in the present invention may be of a multi-layer constitution having a photosensitive layer 114 containing a heat developing type photosensitive composition and a polymerization layer 112 containing a photopolymerizable composition in combination, or of a single layer constitution containing a heat developing type photosensitive composition and a photopolymerizable composition in the same layer as in FIG. 2C. Numeral 115 is a protective layer, 113 is an intermediate layer, or otherwise a subbing layer may be also provided. For the intermediate layer 113, the protective layer 115, various plastic films such as polyethylene terephthalate, polypropylene, polyethylene, Cellophane, polyimide, 6,6-nylon, poly-styrene, etc. or resins such as polyvinyl alcohol, polyvinyl butyral, etc. can be employed. Further, composite materials comprising two or more kinds of these materials can be also employed.

As the above-mentioned heat developing type photosensitive composition, at least a photosensitive silver halide, an organic silver salt and a specific reducing agent are contained, and as the photopolymerizable composition, at least a polymerizable polymer precursor and a photopolymerization initiator are contained. In the following, these are described in detail.

As the silver halide contained in the heat developing type photosensitive composition, known silver halides in photographic technology, etc. can be used. For example, any of silver halide, silver bromide, silver iodide, silver chlorobromide, silver chloroiodide, silver iodobromide, silver chloroiodide can be employed.

The halogenic composition of the silver halide grains may be either uniform or nonuniform on the surface and internally thereof. In the present invention, the grain size of the silver halide grain may be preferably from 0.001 $\mu$m to 10 $\mu$m, particularly from 0.001 to 5 $\mu$m.

These may be also applied with chemical sensitization, optical sensitization as practiced for photographic emulsions in general. As chemical sensitization, sulfur sensitization, noble metal sensitization, reduction sensitization, etc. can be employed, and for optical sensitization, the method by use of an optical sensitizing dye such as cyanine dye, melocyanine dye, etc. is applicable.

As the organic silver salt, there may be included silver salts of aliphatic carboxylic acids, aromatic carboxylic acids, thiocarbonyl group compound having mercapto group of $\alpha$-hydrogen, and imino group containing compounds.

Examples of aliphatic carboxylic acids may include acetic acid, butyric acid, succinic acid, sebacic acid, adipic acid, oleic acid, linoleic acid, linolenic acid, tartaric acid, palmitic acid, stearic acid, behenic acid, camphor acid, etc. However, since silver salts are generally unstable with those having less carbon atoms, those having appropriate carbons are preferable.

Examples of aromatic carboxylic acids may include benzoic acid derivatives, quinoline acid derivatives, naphthalenecarboxylic acid derivatives, salicylic acid derivatives, gallic acid derivatives, tannic acid, phthalic acid, phenylacetic acid derivatives, pyromellitic acid, and others.

As the thiocarbonyl group compound having mercapto group or $\alpha$-hydrogen, there may be included 3-mercapto-4-phenyl-1,2,4-triazole, 2-mercaptobenzoimidazole, 2-mercapto-5-aminothiadiazole, 2-mercaptobenzothiazole, S-alkylthioglycolic acid (alkyl group having 12 to 22 carbon atoms), dithiocarboxylic acids such as dithioacetic acid, etc., thioamides such as thiostearoamide, etc., mercapto compounds as described in U.S. Pat. No. 4,123,274 such as 5-carboxy-1-methyl-2-phenyl-4-thiopyridine, mercaptotriazine, 2-mercaptobenzooxazole, mercaptooxadiazole or 3-amino-5-benzylthio-1,2,4-triazole, etc.

Representative examples of the compound having imino group may include benzotriazole or its derivatives described in Japanese Patent Publications Nos. 44-30270 and 45-18416, for example, alkyl-substituted benzotriazoles such as benzotriazole, methylbenzotriazole, etc., halo-substituted benzotriazoles such as 5-chlorobenzotriazole, etc., carboimidebenzotriazoles such as butylcarboimidebenzotriazole, etc., nitrobenzotriazoles described in Japanese Patent Application Laid-open No. 58-118639, sulfobenzotriazole, carboxy benzotriazole or salts thereof, or hydroxybenzotriazole, etc. described in Japanese Patent Application Laid-open No. 58-115638, 1,2,4-triazole, 1H-tetrazole, carbazole, saccharin, imidazole and derivatives thereof described in U.S. Pat. No. 4,220,709.

As the reducing agent, there may be preferably employed those which form silver by the redox reaction with organic silver salts, etc. under heating with the silver latent image on the photosensitive silver halide as the catalyst, and have the function of reducing the amount of light transmitted by absorbing the light in the absorption wavelength region of the photopolymerization initiator in the polymerization layer, or those of which the oxidized product formed similarly by the redox reaction has the function of absorbing the light in the absorption wavelength range of the photopolymerization initiator.

As available reducing agents, those described in "Shashinkogaku no Kiso, Higinen hen (Basis of Photooptic, Non-silver version), p. 250", primary color forming developing agents, secondary color forming developing agents can be used. Examples of these may include phenols, hydroquinones, catechols, p-aminophenols, p-substituted aminophenols, p-phenylenediamines, 3-pyrazolidones, and otherwise resorcins, pyrogallols, o-aminophenols, m-aminophenol, m-phenylenediamines, 5-pyrazolones, alkylphenols, alkoxyphenols, naphthols, aminonaphthols, naphthalenediols, alkoxynaphthols, hydrazines, hydrazones, hydroxycouromane-hydroxycouramanes, sulfonamidephenols, aminonaphthols, ascorbic acids, hydroxyindanes, bisphenols, orthobisphenols, etc.

Also, a leuco base obtained by reduction of a dye cay be used as the reducing agent. Further, two or more of the reducing agents as mentioned above can be used in combination. When a secondary color forming developing agent is used, it is desirable to use a coupler which forms a light absorbable compound in combination.

Specific examples of the reducing agent may include hydroquinone, hydroquinone monomethyl ether, 2,4-dimethyl-6-t-butylphenol, catechol, dichlorocatechol, 2-methylcatechol, methyl gallate, ethyl gallate, propyl gallate, o-aminophenol, 3,5-dimethyl-2-aminophenol, p-aminophenol, p-amino-o-methylphenol, m-dimethylaminophenol, m-dimethylaminophenol, 2,6-dicyclohexyl-4-methylphenol, 1-naphthol, 2-methyl-1-naphthol, 2,4-dichloro-1-naphthol, 1,1-di-2-naphthol, 2,2'-methylenebis(4-methyl-6-t-butylphenol), 2,2'-methylenebis(4-ethyl-6-t-butylphenol), 2,2'-butylidenebis(4-methyl-6-t-butylphenol), 4,4'-butylidenebis(3-methyl-6-t-butylphenol), 4,4'-methylenebis(2,6-di-t-butylphenol), 1,1,3-tris(2-methyl-4-hydroxy-5-t-butylphenol)butane, 4,4'-thiobis(3-methyl-6-t-butylphenol), 2,4-bis(ethylthio)-6-(4-hydroxy-3,5-di-t-butylanilino)-1,3,5-triazine, 2,4-bis(octylthio)-6-(4-hydroxy-3,5-di-t-butylanilino)-1,3,5-triazine, 2,6-dichloro-4-benzenesulfonamidophenol, 2-chloro-4-benzenesulfonamidophenol, 2,6-dibromo-4-benzenesulfonamidophenol, thioindoxyl, indoxyl, 1,3-dimethyl-pyrogallol, 4-methoxynaphthol, 4-ethoxynaphthol, 2-cyanoacetylcouromane, N,N-dimethylphenylenediamine, N,N-diethylphenylenediamine, N',N'-diethyl-3-methylphenylenediamine and so on.

As the coupler when a secondary color forming developing agent (e.g. phenylenediamine type, p-amino phenol type) is employed, for example, there may be included 1-hydroxy-N-butyl-2-naphthamide, benzoylacetone, benzoylacetanilide, o-methoxybenzoylaceto-o-methoxyanilide, dibenzoylmethane, 2-chloro-1-naphthol, 2,6-dibromo-1,5-naphthalenediol, 3-methyl-1-phenylpyrazolone, etc.

As the light-absorptive compound, either those falling within the category of dyes or not may be available, provided that they can substantially desensitize the sensitivity of photopolymerization initiator. For example, when absorption at UV-portion is utilized, absorption at visible portion will be no problem.

As specific example of combination of the light-absorptive compound and photopolymerization initiator, for example, when 4,4'-methylenebis(2-methyl-6-t-butylphenol), 4,4'-methylenebis(2,6-di-t-butylphenol), etc. are employed as the reducing agent, photopolymerization initiators having sensitivity at 380 to 390 nm can be employed, such as 2-chlorothioxanthone, 2-methylthioxanthone, 2,4-dimethylthioxanthone, 2,4-diethylthioxanthone, 2,4,6-trimethylbenzoyldiphenylphosphine oxide, benzyl, etc.

Also, for 2,6-di-t-butyl-4-benzylphenol, 1-(3,5-di-t-butyl-4-hydroxyphenyl)-1-phenylethane or one capable of forming a cyan dye with a secondary color forming developing agent, a photopolymerization initiator having sensitivity at 300 to 370 nm can be employed, such as 1-phenyl-2-hydroxy-2-methylpropane-1-one, 1-hydroxycyclohexyl phenyl ketone, benzoin dimethyl ether, benzophenone, 4-benzoyl-4'-methyldiphenyl sulfide, etc.

As the polymerizable polymer precursor to be used as the photopolymerizable composition, compounds having at least one reactive vinyl group in one molecule can be utilized.

As the reactive vinyl group of these compounds, substituted or nonsubstituted vinyl groups having polymerization reactivity may be included, such as styrene type vinyl group, acrylic acid type vinyl group, methacrylic acid vinyl group, allyl type vinyl group, vinyl ether and otherwise ester type vinyl group such as vinyl acetate, etc.

Specific examples of the polymerizable polymer precursor satisfying such conditions are as follows.

For example, there can be included monovalent monomers such as styrene, methylstyrene, chlorostyrene, bromostyrene, methoxystyrene, dimethylamino-styrene, cyanostyrene, nitrostyrene, hydroxystyrene, aminostyrene, carboxystyrene, acrylic acid, methyl acrylate, ethyl acrylate, cyclohexyl acrylate, acrylamide, methacrylic acid, methyl methacrylate, ethyl methacrylate, propyl methacrylate, butyl methacrylate, phenyl methacrylate, cyclohexyl methacrylate, vinylpyridine, N-vinylpyrrolidone, N-vinylimidazole, 2-vinylimidazole, N-methyl-2-vinylimidazole, propyl vinyl ether, butyl vinyl ether, isobutyl vinyl ether, $\beta$-chloroethyl vinyl ether, phenyl vinyl ether, p-methylphenyl vinyl ether, p-chlorophenyl vinyl ether, etc.; divalent monomers such as divinylbenzene, distyryl oxalate, distyryl malonate, distyryl succinate, distyryl glutarate, distyryl adipate, distyryl maleate, distyryl fumarate, distyryl $\beta,\beta$-dimethylglutarate, distyryl 2-bromoglutarate, distyryl $\alpha,\alpha'$-dichloroglutarate, distyryl terephthalate, oxalic acid di(ethyl acrylate), oxalic acid di(methylethyl acrylate), malonic acid di(ethyl acrylate), malonic acid di(methylethyl acrylate), succinic acid di(ethyl acrylate), glutaric acid di(ethyl acrylate), adipic acid di(ethyl acrylate), maleic acid di(diethyl acrylate), fumaric acid di(ethyl acrylate), $\beta,\beta$-dimethylglutaric acid di(ethyl acrylate), ethylenediacrylamide, propylenediacrylamide, 1,4-phenylenediacrylamide, 1,4-phenylenebis(oxyethylacrylate), 1,4-phenylenebis(oxymethylethylacrylate), 1,4-phenylenebis(acryloyloxyethoxy)cyclohexane, 1,4-bis(acryloyloxymethylethoxy)cyclohexane, 1,4-bis(acryloyloxyethoxycarbamoyl)benzene, 1,4-bis(acryloyloxymethylethoxycarbamoyl)benzene, 1,4-bis(acryloyloxyethoxycarbamoyl)cyclohexane, bis(acryloyloxyethoxycarbamoylcyclohexyl)methane, oxalic acid di(ethyl methacrylate), oxalic acid di(methylethyl methacrylate), malonic acid di(ethyl methacrylate), malonic acid di(methylethyl methacrylate), succinic acid di(ethyl methacrylate), succinic acid di(methylethyl methacrylate), glutaric acid di(ethylmethacrylate), adipic acid di(ethyl methacrylate), maleic acid di(ethyl methacrylate), fumaric acid di(ethyl methacrylate), fumaric acid di(methylethyl methacrylate), $\beta,\beta'$-dimethylglutaric acid di(ethyl methacrylate), 1,4-phenylenebis(oxyethyl methacrylate), 1,4-bis(methacryloyloxyethoxy)-cyclohexaneacryloyloxyethoxyethyl vinyl ether, etc.; trivalent monomers such as pentaerythritol triacrylate, pentaerythritol trimethacrylate, pentaerythritol tri(hydroxystyrene), cyanuric acid triacrylate, cyanuric acid trimethacrylate, 1,1,1-trimethylolpropane triacrylate, 1,1,1-trimethylolpropane trimethacrylate, cyanuric acid tri(ethlacrylate), 1,1,1-trimethylolpropane tri(ethyl acrylate), cyanuric acid tri(ethyl vinyl ether), condensate of 1,1,1-trimethylolpropane tri(toluene diisocyanate) and hydroxyethyl acrylate, condensate of 1,1,1-trimethylolpropane tri(-hexane diisocyanate) and p-hydroxystyrene, etc.; tetravelent monomers such as ethylenetetraacrylate, propylenetetraacrylamide, etc.

As described above, two or more kinds of these polymerizable polymer precursors may be also employed.

As the photopolymerization initiator, carbonyl compounds, sulfur compounds, halide compounds, redox type photopolymerization initiators, etc. may be employed.

Specifically, examples of carbonyl compounds may include diketones such as benzyl, 4,4'-dimethoxybenzyl, diacetyl, camphor quinone, etc.; benzophenones such as 4,4'-bis(diethylamino)benzophenone, 4,4'-dimethoxybenzophenone, etc.; acetophenones such as acetophenone, 4'-methoxyacetophenone, etc.; benzoin alkyl ethers; thioxanthones such as 2-cyclothioxanthone, 2,4-diethylthioxanthone, thioxanthone-3-carboxylic acid-$\beta$-methoxyethyl ester, etc.; chalcones and styrylketones having dialkylamino group; coumarines such as 3,3'-carbonylbis(7-methoxycoumarine), 3,3'-carbonylbis(7-diethylaminocoumarine), etc.

Examples of sulfur compounds may include dibenzothiazolyl sulfide, decylphenyl sulfide, disulfides, etc.

Examples of halide compounds may include carbon tetrabromide, quinolinesulfonyl chloride, S-triazines having trihalomethyl group, etc.

As the redox type photopolymerization initiator, there may be included those by using trivalent iron ion compounds (e.g. ferric ammonium citrate) in combination with peroxides, etc., or those by using photoreducible dyes such as riboflavin, Methylene Blue, etc. in combination with a reducing agent such as triethanolamine, ascorbic acid, etc.

In the photopolymerization initiator as described above, photopolymerization with good efficiency can be also carried out by combining two or more kinds.

As such combination of photopolymerization initiators, there may be included combinations of chalocones and styrylketones having dialkylamino group or coumarines with S-triazines having trihalomethyl group or camphor quinone, etc.

In addition to these photosensitive silver salts and reducing agents, if necessary, binders, tone agents, film forming agents, antifoggants, photodiscoloration preventives, solid solvents, surfactants, antistatic agents, etc. can be added.

The binder, film forming agent available in the present invention can be chosen from a wide scope of resins. Specifically, there may be employed cellulose esters such as nitrocellulose, cellulose phosphate, cellulose sulfate, cellulose acetate, cellulose propionate, cellulose butyrate, cellulose myristate, cellulose palmitate, cellulose acetate propionate, cellulose acetate butyrate and the like; cellulose ethers such as methyl cellulose, ethyl cellulose, propyl cellulose, butyl cellulose and the like; vinyl resins such as polystyrene, polyvinyl chloride, polyvinyl acetate, polyvinyl butyrate, polyvinyl acetal, polyvinyl alcohol, polyvinyl pyrrolidone, etc.; copolymer resins such as styrene-butadiene copolymer, styrene-acrylonitrile copolymer, styrene-butadiene-acrylonitrile copolymer, vinyl chloride-vinyl acetate copolymer, etc.; acrylic resin such as polymethyl methacrylate, polymethyl acrylate, polybutyl acrylate, polyacrylic acid, polymethacrylic acid, polyacrylamide, polyacrylonitrile, etc.; polyesters such as polyethylene terephthalate, etc.; polyacrylate resins such as poly(4,4'-isopropylidene, diphenylene-co-1,4-cyclohexylenedimethylenecarbonate), poly(ethylenedioxy-3,3'-phenylenethiocarbonate), poly(4,4'-isopropylidenediphenylenecarbonate-co-terephthalate), poly(4,4'-isopropylidenediphenylenecarbonate), poly(4,4'-sec-butylidenediphenylenecarbonate, poly(4,4'-isopropylidenediphenylenecarbonate-block-oxyethylene), etc.; polyamides; polyimides; epoxy resins; phenol resins; polyolefins such as polyethylene, polypropylene, chlorinated polyethylene, etc.; and natural high molecular compounds such as gelatin, etc.

The image forming member of the present invention can be formed by dissolving the above-described essential components together with a binder which may be conveniently used in a solvent and coating the solution on a support such as a metal, a plastic, a paper, etc., or when the binder itself can hold its strength, by molding a film or a sheet formed with the binder with the above-described essential components contained therein.

The shape of the photosensitive member of the present invention is not particularly limited, but may be, for example, a flat plate, a cylinder, a roll, etc.

The photosensitive member of the present invention should be preferably used by film formation into a thickness of 0.1 μm to 2 mm, preferably 1 μm to 0.1 mm.

Figure 8A:
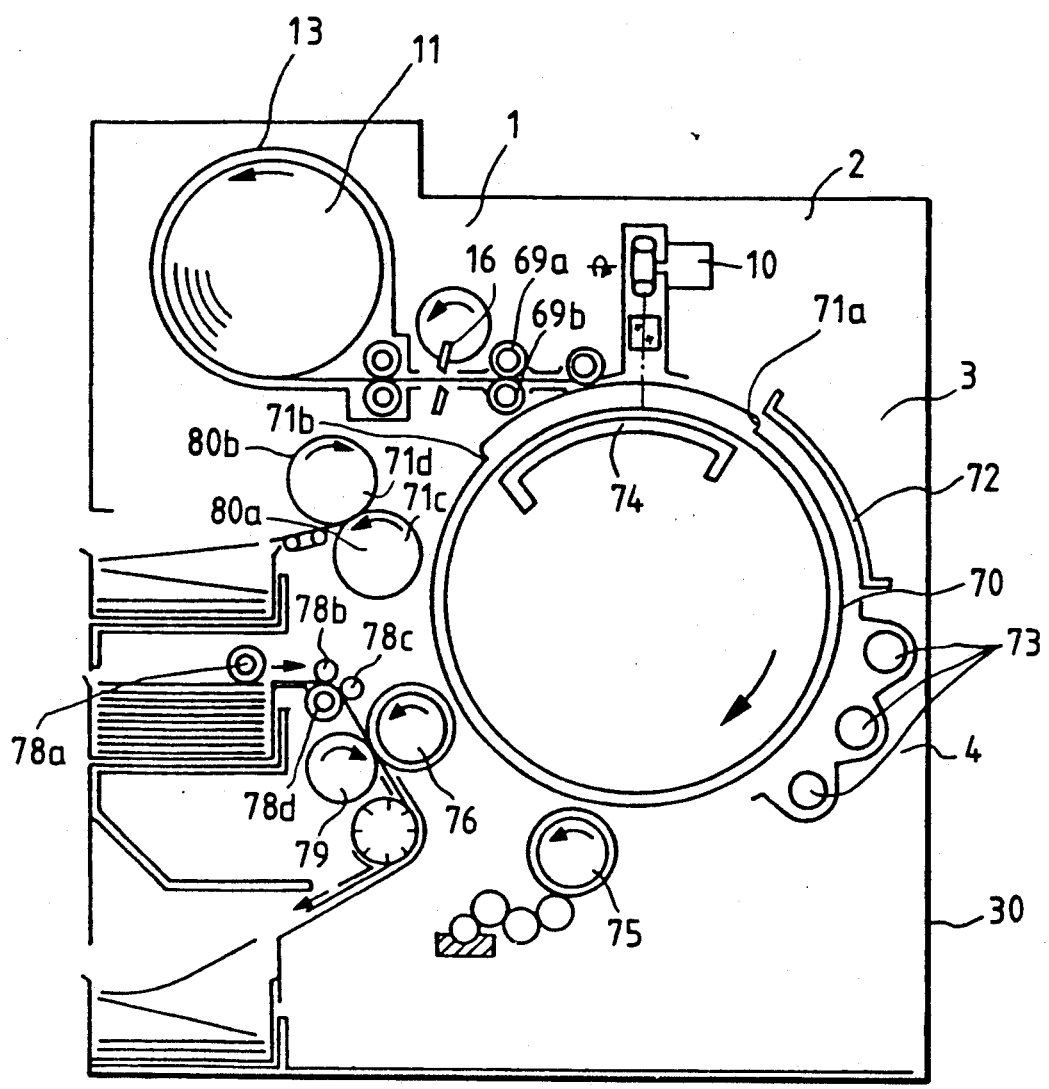
FIG. 8A is a schematic sectional view showing another embodiment of the present invention.
Figures 2, 8B:
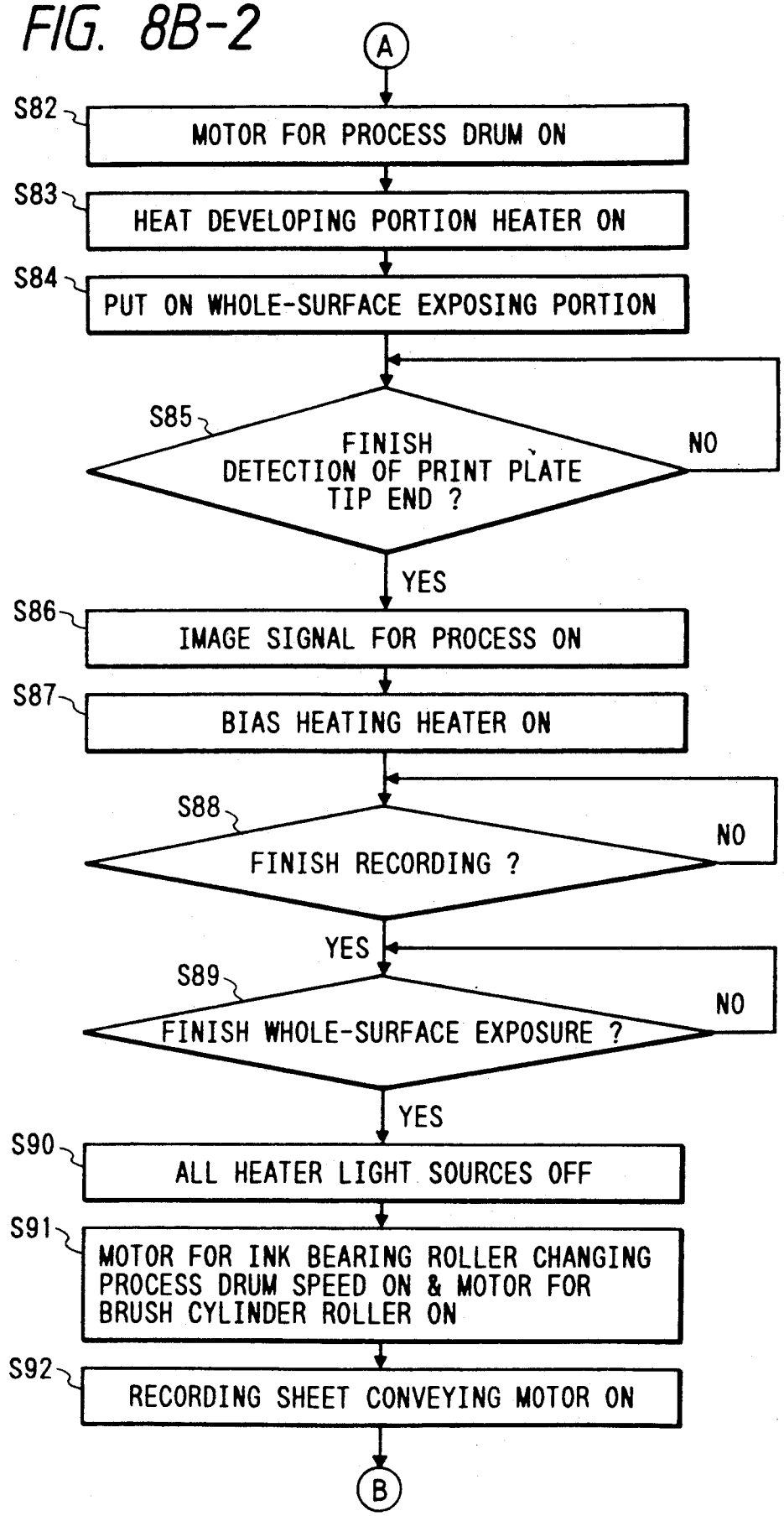
Figures 3, 8B:
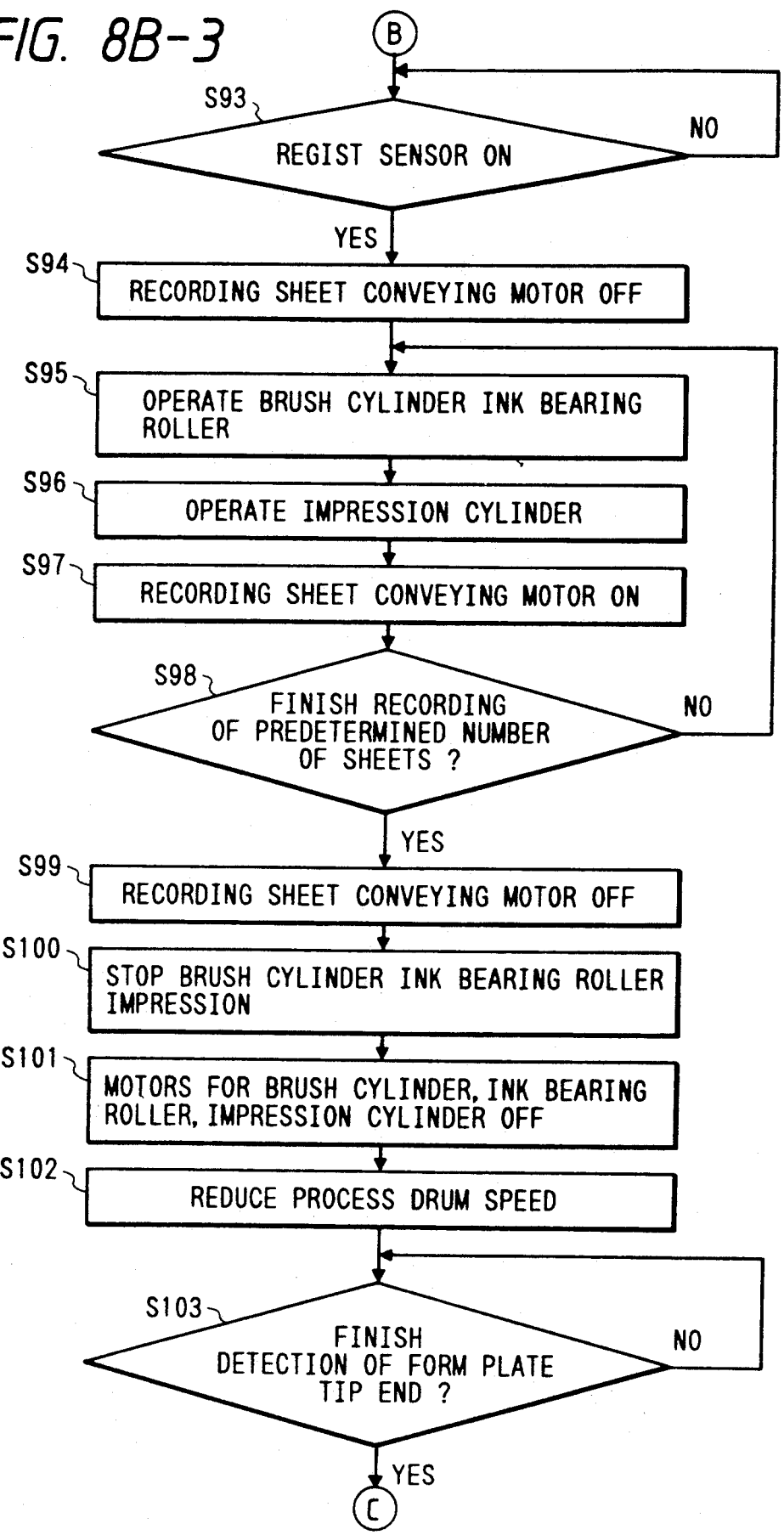
Figures 4, 8B:
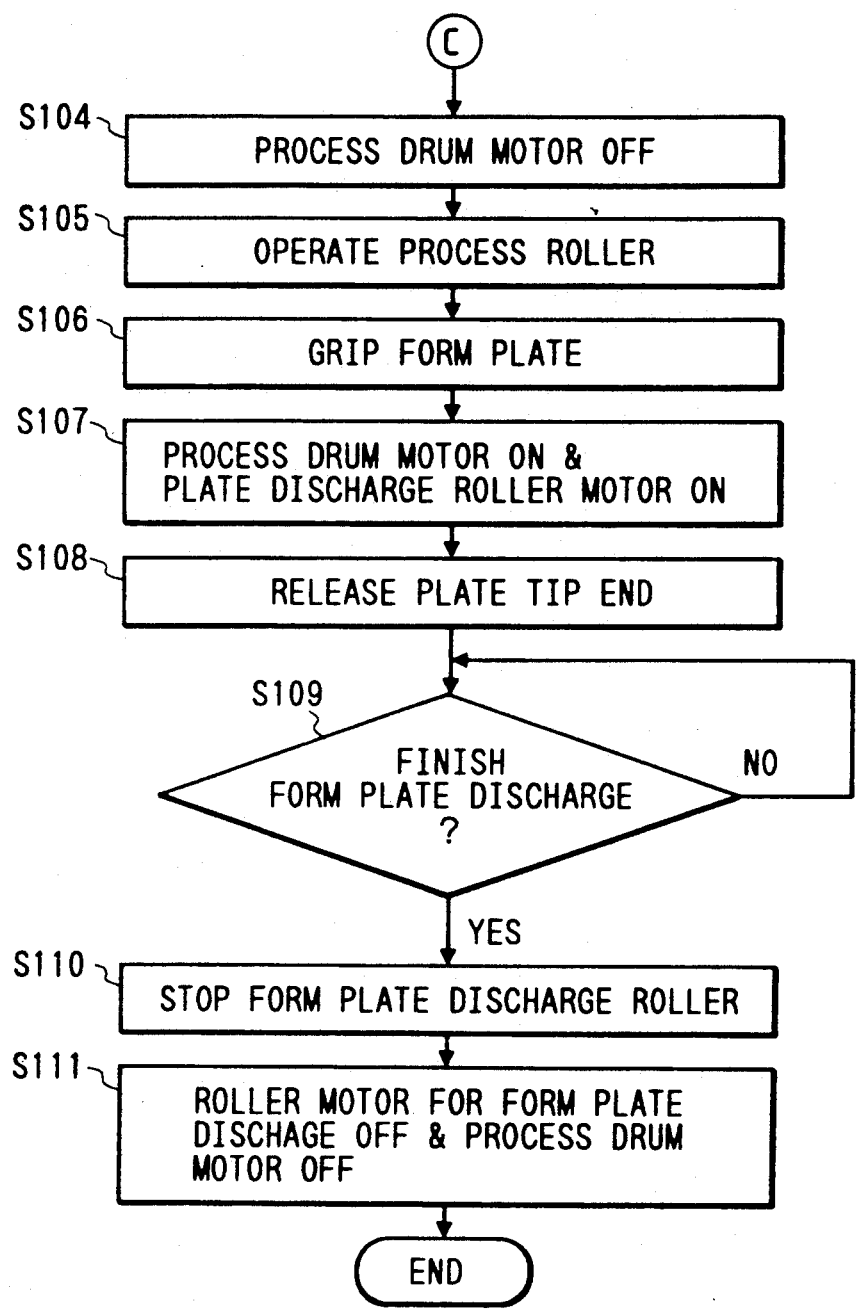

Actuation of the image forming device by use of the above-described photosensitive member is described by use of the flow chart in FIG. 3.

First, when the main switch (not shown) is turned on, the motors of the respective rollers for conveying in the heating developing section, the whole-surface portion and the heaters of the heat source are driven, and the light sources are lighted (steps S1 to S4). Next, the photosensitive member 11 is delivered from the paper feeding portion 1 by the convey rollers 14, 15 (S5). The cutter portion sensor (not shown) detects the tip end of the paper, and then delivers a signal to the control portion (not shown) so that the tip end of the photosensitive member 11 may stop conveyance at the position of the convey roller 17 (steps S6, S7).

At the control portion which has received the above-mentioned signal, when receiving the signal (S8), conveyance is started again (S9) to deliver the image signal to the image exposure portion (S10) to perform writing on the photosensitive member 11 (S11). After finish of writing, conveyance of the photosensitive member 11 is stopped, followed by cutting (S12).

After confirmation of cutting of the sheet, the cutting actuation motor is turned OFF (S14, S15). Next, the sheet is again conveyed and discharged by passing through the heat developing portion, the whole-surface exposure portion. At this time, after confirmation of the discharged paper by a discharged paper sensor (not shown), the convey roller actuating motor is turned OFF. Next, when there is next page recording in whether recording next page or not, paper feeding is done again. When there is nothing, the heat developing portion actuating motor, heater are turned off, and the whole-surface exposure portion light source, heater are turned OFF to finish the image formation steps.

Figure 4:
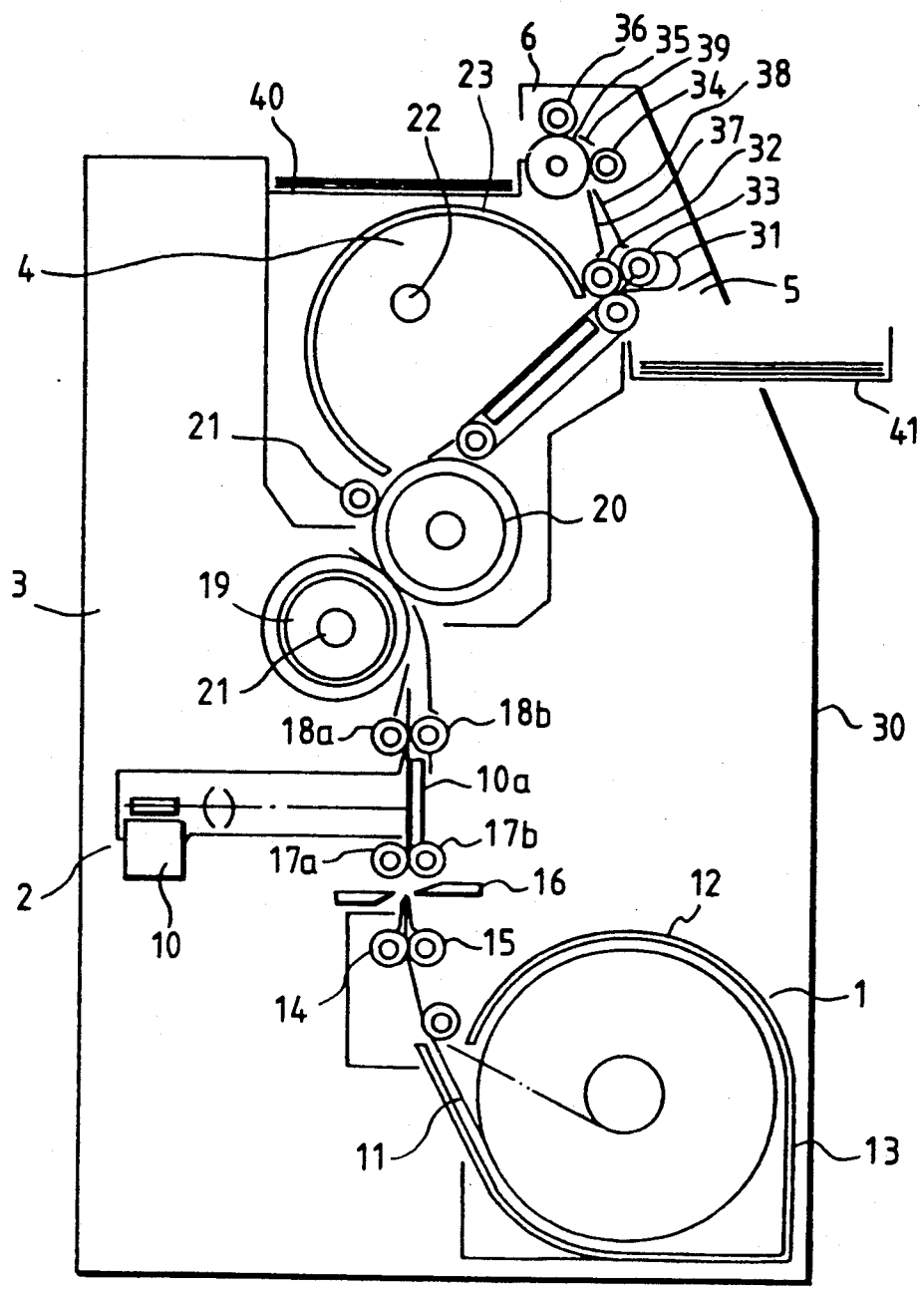
FIG. 4 is a schematic sectional view showing another embodiment of the present invention.

The devices in FIG. 4 et seq have means for forming the above polymer image or visible image after formation of the polymer image, or improving the contrast of the polymer image in addition to the device shown in FIG. 1.

In FIG. 4, the paper feeding portion 1, the image exposure portion 2, the heat developing portion 3, the whole-surface exposure portion 4 and the discharging portion 5 are the same as in the foregoing embodiment. In the device in FIG. 4, there is assembled the function of improving the contrast of the polymer image by separating the polymerized portion from the unpolymerized portion through the difference in tackiness after formation of the polymer image.

To describe about the peeling portion 6 after the whole-surface exposure portion 4 which is the difference from FIG. 1, the photosensitive member 11 has the same components as in FIG. 2B. First, the photosensitive member 11 delivered from the whole-surface exposure portion 4 effects peeling with a peeling nail 31 at between the photopolymerization layer 112 and the intermediate layer 113 in the layer constitution in FIG. 2B. And, the protective film 115, the photosensitive layer 114, the intermediate layer 113 and the unpolymerized portion of the polymerization layer 112 are delivered by the rollers 32, 33, 34, 35, 36 and convey guides 37, 38, 39 to the discharge tray 40. On the other hand, the polymerized portion of the polymerized layer 112 and the substrate 111 are delivered to the discharge tray 41.

Thus, the photosensitive member 11 has an intermediate layer 113 with different closeness degree from the substrate 111 through the difference in tackiness of the polymer image provided on the polymerization layer. By peeling off the intermediate layer after formation of the polymer image, at least one of the polymerized portion and the unpolymerized portion is adhered and separated, and the contrast of the polymer image is improved according to this method. Of the images separated, by effecting whole-surface exposure on the image having the unpolymerized portion, a counterpart image and a negative image are formed as a matter of course. By use of the device of this embodiment, there is the advantage that both positive-negative polymer images can be formed.

Actuation of the device in FIG. 4 is the same as the actuation of the device in FIG. 1. As the peeling means, a separation nail was employed, but as other means, there can be also applied such means as peeling by use of a scraper or through difference in tackiness to the surfaces of the two layers, or separation and peeling of the photosensitive member through the opposed rollers by utilizing the difference in relative speed of the respective rollers.

Figures 2, 5B:
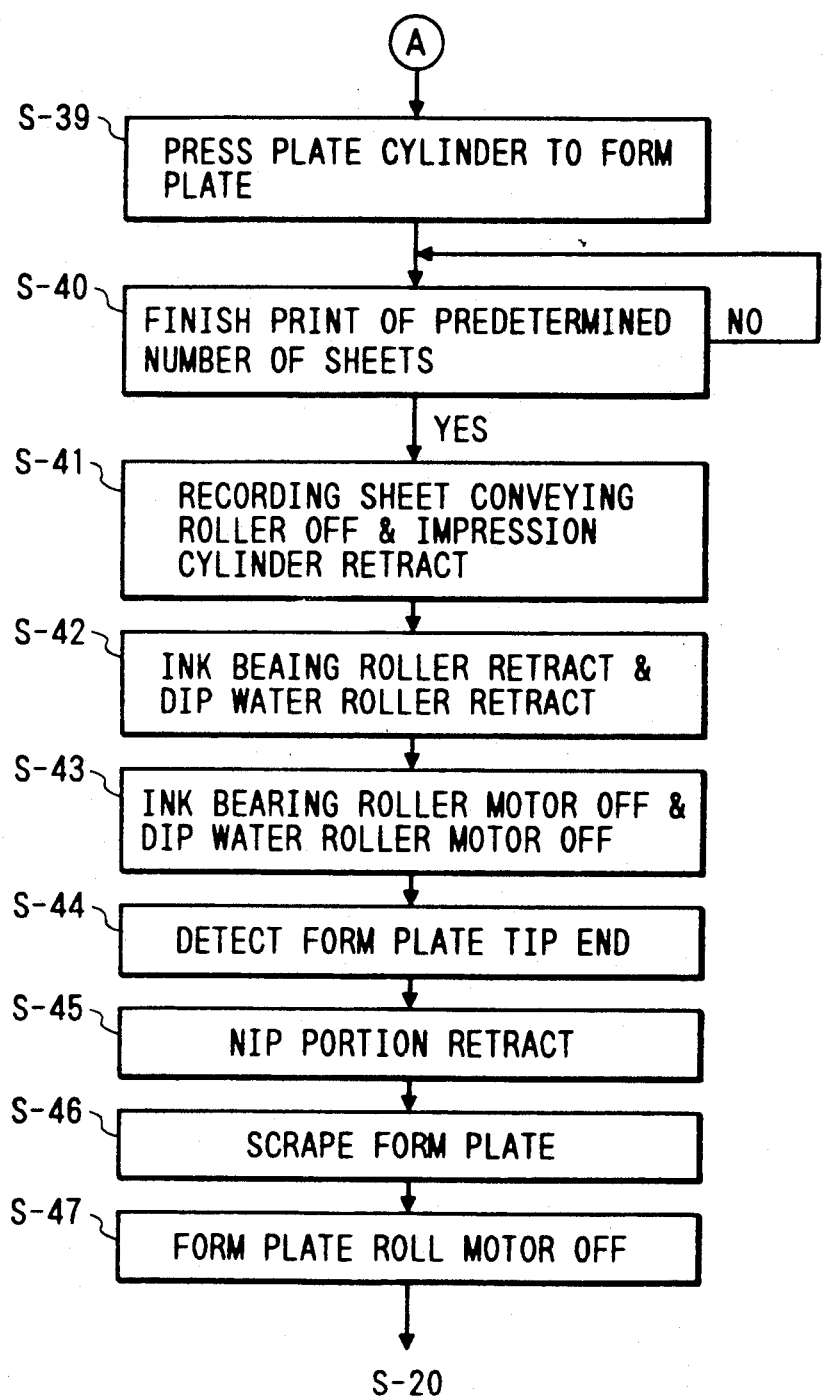
Figure 6:
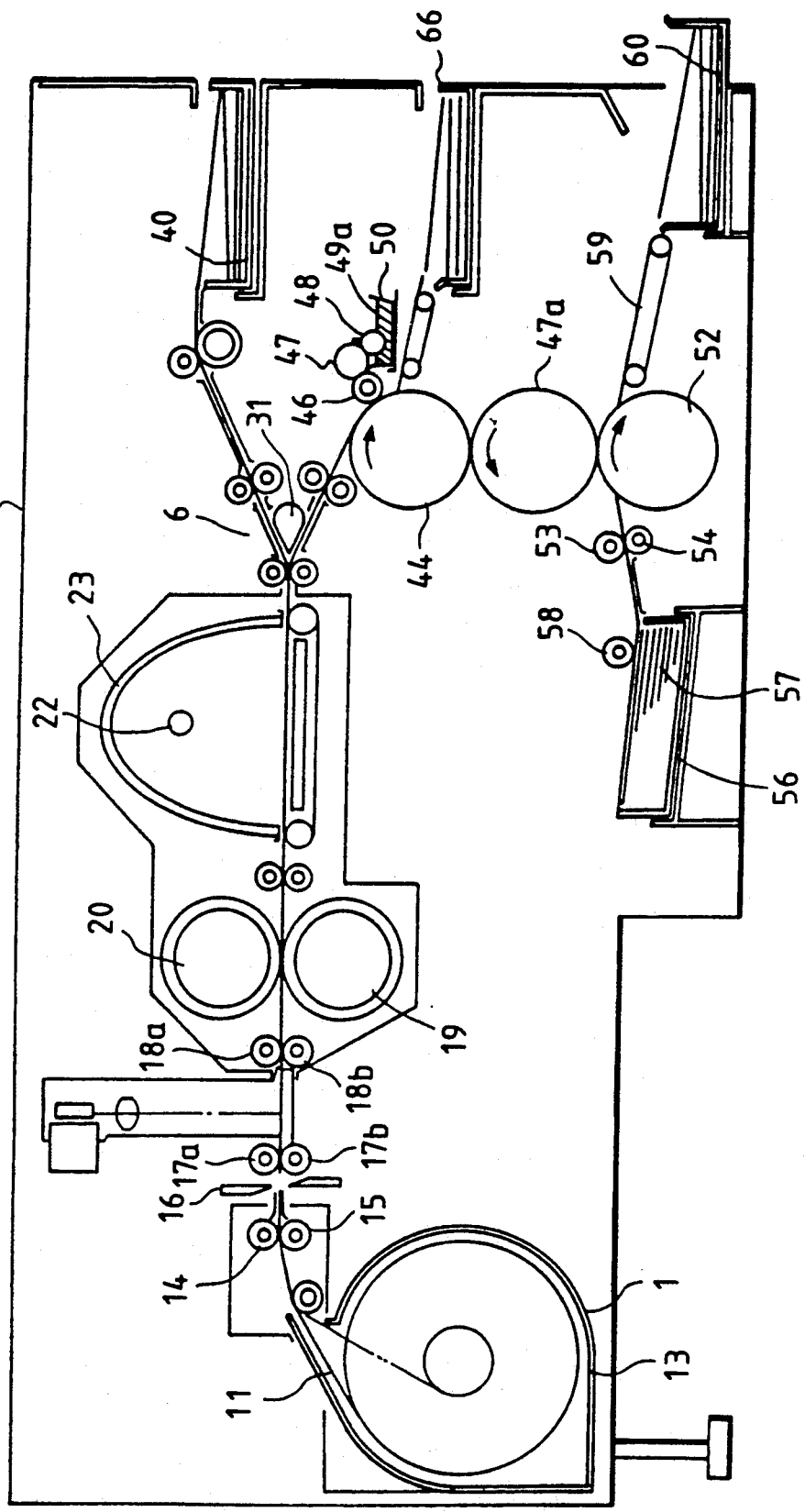
FIG. 6 is a schematic sectional view showing another embodiment of the present invention.

FIGS. 5 and 6 are schematic sectional views of the color image forming devices of other embodiments.

The photosensitive member 11 having formed a polymer image thereon via the above-described steps has difference in physical properties such as wettability, tackiness to the ink material on the surface depending on the polymerization degree of the polymer. Through such difference, a color image which is a visible image is formed by coating an ink or powder on the photosensitive member 11.

In FIGS. 5A and 6, numerals 50 is an ink bottle, 49a ink, and a commercially available ink for off-set can be used. 47 and 48 are ink convey rollers, 46 an ink bearing roller, which may be constituted of a resin such as rubber or plastic, and the ink 49a is fed to a uniform thickness to the print plate 11a fixed on the plate cylinder 44. Numerals 61 is dip water dish, 62 dip water, 63, 64 and 65 are dip water convey rollers, and similarly as in the case of FIG. 4 as described above, onto the print plate 11a formed by peeling with a peeling nail 31 is uniformly fed dip water. Numerals 66 is a discarding stocker for discarding the print plate 11a after finish of printing. 56 is a paper feeding stocker, 57 a recording paper which is image receiving member and 60 a recovery stocker.

In the following, actuation in this device is described by referring to FIG. 5B.

FIG. 5B is a flow chart showing actuation of the present device. The steps upto the peeling step 6 are the same as in the foregoing embodiment (step S-16). After peeling, the photosensitive member 11 having an image cured by polymerization (hereinafter called "printing plate 11a") is conveyed to the plate cylinder 44 by convey rolls 42, 43 (S-30) to rotate the plate cylinder motor (S-31) and fixed closely onto the plate cylinder by the nip portion 45 (S-32).

By rotating the ink roller, dip water roller (S-33), the ink and the dip water are uniformly coated on the roller. Next, the roller coated uniformly with dip water is pressure coated on the form plate, whereby dip water is coated at the non-image portion of the form plate (S-34). By detecting the tip end of the form plate (S-35), the ink roller coated uniformly with the ink 49a is pressure contacted on the form plate, whereby the image portion is coated with the ink (S-36).

Next, by detecting the tip end of the form plate (S-37), the recording paper convey roller rotates (S-38), and further the impression cylinder is pressure contacted onto the form plate (S-39), whereby the tip end of the recording paper and the tip end of the form plate are synchronized to initiate printing. After finish of a predetermined number of sheets (S-40), the recording paper convey roller is stopped to stop recording paper conveyance, and at the same time the impression cylinder is retracted from the form plate (S-41). After detracting the ink bearing roller, the dip water roller (S-42), the ink bearing roller motor, the dip water roller motor are stopped (S-43). Next, by detecting the tip end of the form plate (S-44), the nip portion is retracted (S-45), the form plate is discarded to the discharge stocker (S-46), and the form plate roll motor is stopped (S-47). The device in FIG. 6 has further a brush cylinder 47a provided in the device shown in FIG. 5.

Figure 7A:
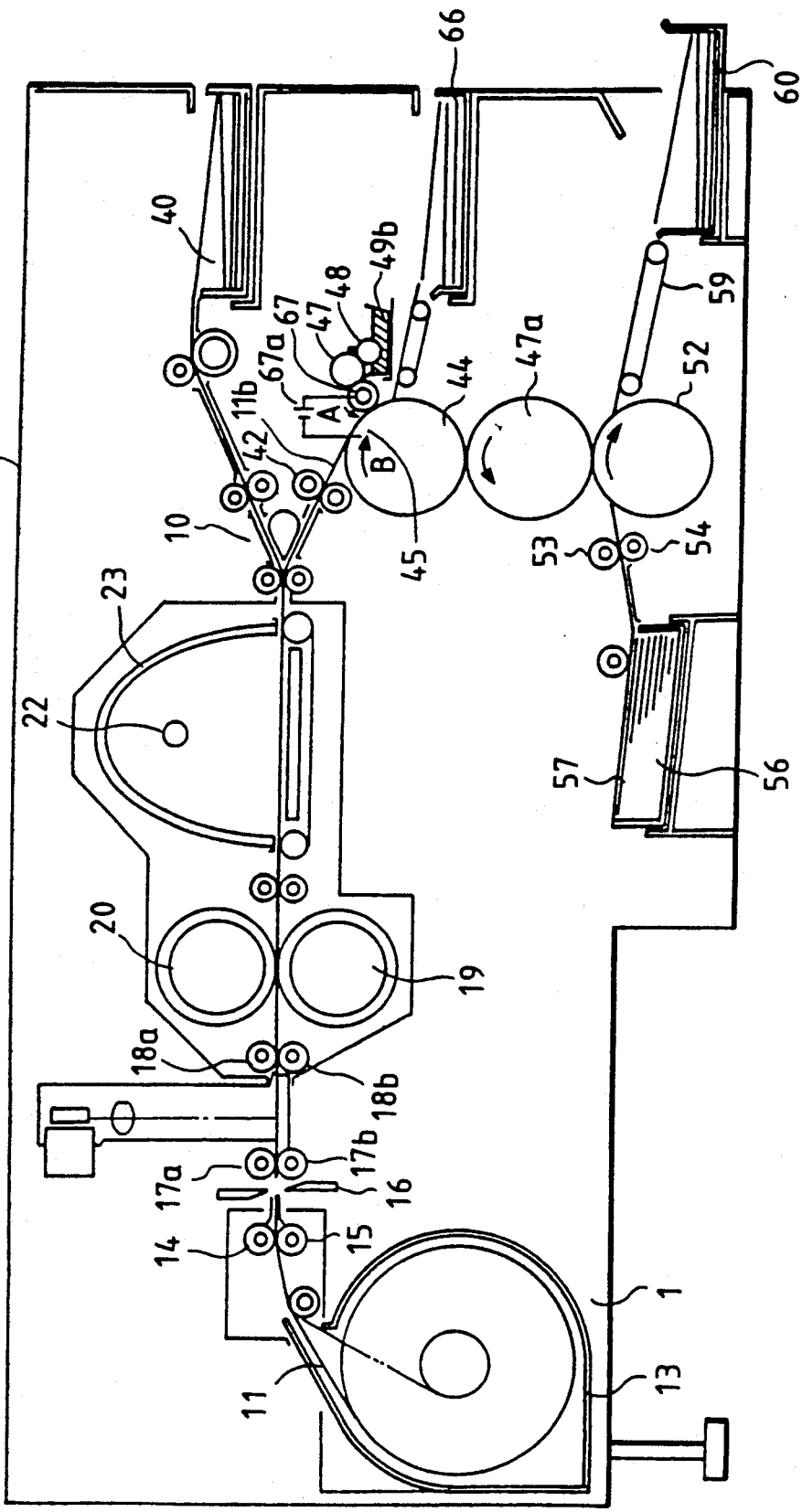
FIG. 7A is a schematic sectional view showing another embodiment of the present invention.

FIG. 7A is a schematic sectional view of another embodiment of the color image forming device. The steps up to the peeling step 6 are the same as in the foregoing embodiments.

In the FIG. 7A, the ink bearing roll 67 is formed of a conductor such as aluminum, copper, stainless steel, etc., has a cylindrical shape and rotates. On the surface of the ink bearing roll 67 (cylindrical surface), the ink 49b which is a recording material is formed by rollers 47, 48 to a uniform thickness.

The ink bearing roll 67 is connected to one end of a direct current power source 67a. With the ink 49b on the surface of the ink bearing roll 67 is contacted the plate 11b rolled on the plate roll 44. The form plate 11b has a desired pattern comprising an insulating material provided on a substrate comprising an electroconductive material.

As the material of the substrate, there may be employed aluminum, copper, stainless steel, platinum, gold, chromium, nickel, phosphorus, bronze, carbon, etc., electroconductive polymers or various polymers in which metal fillers are dispersed. As the material for the pattern 4b, the photopolymerizable composition as described above may be employed.

By applying thus a voltage between the form plate 11b and the ink bearing roll 67 from a power source 67a, adhesiveness of the ink 49b in contact with the conductive portion of the form plate 11b changes, and through the difference in adhesiveness, the ink 49b is attached in a pattern on the plate to form an ink image.

The thickness of the ink layer 49b formed on the ink bearing roll surface should be preferably about 0.001 to 5 mm.

If the layer thickness of the ink layer 49b is less than 0.001 mm, it becomes difficult to form a uniform ink layer on the ink bearing roll 67. On the other hand, if the ink layer thickness exceeds 5 mm, it becomes difficult to convey the ink layer 49b while maintaining the surface layer of the ink layer (the layer on the side in contact with the conductive pattern plate roll 44) at a uniform circumferential speed, and also electric communication between the ink bearing roll 67 and the form plate 11b becomes cannot be effected easily.

Next, the ink image on the form plate 11b is transferred onto the brush cylinder 47a while pressure contacting the ink image with the plate 11b, and further the ink image on the brush cylinder 47a is transferred onto a recording medium 57 (paper, cloth, metal sheet, etc.) which passes between the brush cylinder 47a and the impression cylinder 52 rotating in pressure contact therewith, thereby forming an image corresponding to the above ink image on the recording medium 57.

In some cases, the ink image on the plate 11b may be also transferred directly onto the recording medium 57 without provision of the brush cylinder 47a. However, by provision of the brush cylinder 47a, abrasion deterioration of the form plate can be prevented depending on its material, and also an image with the same pattern as the form plate can be formed on the recording medium.

In the embodiment shown in FIG. 7A, the form plate 11b employed is wound around a cylindrical plate roll 44. It is also possible to form an ink image on the form plate, even if the form plate 11b is employed in the form of a flat plate as the electrode. In that embodiment the plate 11b is coated with an ink and a voltage applied when the ink is sandwiched between the plate and the counter-electrode.

The image forming method to which the ink of the present invention is preferably applicable is one which utilizes adhesiveness of the ink corresponding to the pattern of the electrode by supplying a specific ink between an electrode (plate) provided with a desired insulating pattern and a counter-electrode and applying a voltage between the above pair of electrodes. The ink employed has adhesiveness under the state without application of voltage, and becomes nonadhesive onto one electrode and adhesive onto the other electrode by application of a voltage. In this case, ink is attached onto the insulating portion of the form plate to form a desired recorded image.

In the following, the ink to be used in this image forming method is described.

The mechanism in which the ink changed from adhesiveness to non-adhesiveness by application of a voltage is explained.

The ink to be used in the present invention undergoes electrolysis by current passage by application of a voltage to generate a gas, whereby adhesiveness changes. In this case, by controlling the ink so as to have inherently adhesiveness and generating a gas in the vicinity of one electrode by application of a voltage, the ink will not adhere onto the electrode on account of the gas. For making the ink so as to generate a gas by electrolysis, an electrolyte is dissolved in a solvent in the ink such as water, alcohol, glycol, etc. The electrical resistance of the ink may be preferably lower, and its volume resistivity should be preferably made $10^5 \Omega \cdot cm$ or lower. If the volume resistivity exceeds $10^5 \Omega \cdot cm$, the current passage quantity is lowered, or a high voltage is required for preventing lowering in current passage quantity.

As the ink to be used in the present invention, a liquid such as water or alcohol has weak cohesive force, whereby no suitable tackiness can be obtained. The ink should be preferably such that, for example, when the ink is attached with a thickness of 2 mm on a platinum plated stainless steel plate held vertically, the ink should be substantially held on the platinum plated stainless steel plate. Also, when the ink is sandwiched with a thickness of 2 mm between the two sheets of platinum plated stainless steel plates, and the two sheets of the platinum plated stainless steel plates are separated from each other under the state without application of a voltage, the ink should be preferably adhered to both the plates to the same extent.

The ink assuming the above mechanism is constituted of a liquid dispersing medium, and may further contain inorganic or organic fine particles. The fine particles in the ink improve separability of ink, thereby improving resolution of the image. The ink is an amorphous solid of colloid sol, which is non-Newtonian flow in fluidity.

As the fine particles to be incorporated in the ink, there can be used particles of a metal (Au, Ag, Cu, etc.), particles of a sulfide (zinc sulfide ZnS, antimony sulfide $Sb_2S_3$, potassium sulfide $K_2S$, calcium sulfide CaS, germanium sulfide GeS, cobalt sulfide CoS, tin sulfide SnS, iron sulfide FeS, copper sulfide $Cu_2S$, manganese sulfide MnS, molybdenum sulfide $Mo_2S_3$, etc.), particles of silicic acid (orthosilicic acid $H_4SiO_4$, metasilicic acid $H_2SiO_3$, mesodisilicic acid $H_2Si_2O_5$, mesotri-silicic acid $H_4Si_3O_3$, mesotetrasilicic acid $H_6Si_4O_{11}$, etc.), polyamide resin particles, polyamideimide resin particles, iron hydroxide particles, aluminum hydroxide particles, fluorinated mica particles, polyethylene particles, montmorillonite particles, fluorine resin, etc. Also, polymer particles containing various charge controllers used as the toner for electrophotography can be employed.

As the above-mentioned fine particles, those having an average particle size of 100 μm, preferably 0.1 μm to 20 μm, above all 10 μm or less, can be employed, and such fine particles can be contained in the ink in amounts of 1 part by weight or more, preferably 3 parts by weight to 90 parts by weight, more preferably 5 parts by weight to 60 parts by weight, based on 100 parts by weight of the ink.

As the liquid dispersing medium used for the ink, there can be employed water, ethylene glycol, propylene glycol, diethylene glycol, triethylene glycol, tetraethylene glycol, polyethylene glycol (weight average molecular weight, about 100 to 1000), ethylene glycol monomethyl ether, ehtylene glycol monoethylene ether, ethylene glycol monobutyl ether, methylcarbitol, ethylcarbitol, butylcarbitol, ethylcarbitol acetate, diethylcarbitol, triethylene glycol monomethyl ether, triethylene glycol monoethyl ether, propylene glycol monomethyl ether, glycerine, triethanolamine, formamide, dimethylformamide, dimethyl sulfoxide, N-methyl-2-pyrrolidone, 1,3-dimethylimidazolidinone, N-methylacetamide, ethylene carbonate, acetamide, succinonitrile, dimethyl sulfoxide, sulforane, furfuryl alcohol, N,N-dimethylformamide, 2-ethoxyethanol, hexamethylphosphoric triamide (hexamethylphosphoric acid triamide), 2-nitropropane, nitroethane, γ-butyrolactone, propylene carbonate, 1,2,6-hexane triol, dipropylene glycol, hexylene glycol, etc., which may be used either singly or as a solvent mixture of two or more kinds. The liquid dispersing medium should be contained in an amount preferably of 40 to 95 parts by weight, more preferably 60 to 85 parts by weight, based on 100 parts by weight of the ink.

According to preferable examples, for controlling the viscosity of the ink, a polymer soluble in the liquid dispersing medium as described above can be contained in the ink material at a ratio of 1 to 90 parts by weight, further 1 to 50 parts by weight, particularly 1 to 20 parts by weight, based on 100 parts by weight of the ink material. As such polymer, there can be employed plant type polymers such as guar gum, locust bean gum, gum arabic, tragacanth, carrageenan, pectin, mannan, starch, etc.; microorganism type polymers such as xanthan gum, dextrin, succinoglucan, curdrun, etc.; animal polymers such as gelatin, casein, albumin, collagen, etc.; cellulose type polymers such as methyl cellulose, ethyl cellulose, hydroxyethyl cellulose, etc., or starch type polymers such as soluble starch, carboxymethyl starch, methyl starch, etc., alginic acid type polymers such as propylene glycol alginate, alginic acid salts, etc., other semi-synthetic polymerases such as polysaccharide type derivatives, etc.; vinyl polymers such as polyvinyl alcohol, polyvinyl pyrrolidone, polyvinyl methyl ether, carboxyvinyl polymer, sodium polyacrylate, etc.; other synthetic polymers such as polyethylene glycol, ethylene oxide-propylene oxide block copolymer, alkyd resin, phenol resin, epoxy resin, aminoalkyd resin, polyester resin, polyurethane resin, acrylic resin, polyamide resin, polyamideimide resin, polyesterimide resin, silicone resin, etc., either singly or in combination of two or more kinds. Also, greases such as silicone grease, liquid polymers such as polubuene, etc. can be employed.

Further, as fine particles, in addition to those as mentioned above, silica fluorinated carbon, titanium oxide, carbon black, etc.can be employed.

In specific examples of ink, when rheological characteristics of ink are considered, it is preferable to use swellable fine particles which can hold the liquid dispersing medium as described above in all or a part of the fine particles in the ink. Examples of such swellable fine particles may include fluorinated mica such as Na-montmorillonite, Ca-montmorillonite, 3-octahedral synthetic smectite, Na-hectorite, Li-hectorite, Na-teniorite, Na-tetrasilicic mica, Li-teniorite, etc., synthetic mica, silica, etc. The above-mentioned fluorinated mica can be represented by the following formula (1).

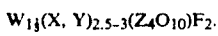
$$W_{1\frac{1}{3}}(X, Y)_{2.5-3}(Z_4O_{10})F_2.\qquad\text{formula (1)}$$

In the formula, W represents Na or Li, X and Y 6 coordinated ions such as $Mg^{2+}$, $Fe^{2+}$, $Ni^{2+}$, $Mn^{2+}$, $Al^{3+}$, $Fe^{3+}$, $Li^+$, etc., Z a cation with a coordination number of 4 such as $Al^{3+}$, $Si^{4+}$, $Ge^{4+}$, $Fe^{3+}$, $B^{3+}$ or a combination of these ($Al3+/Si4+$), etc.

The average particle size of the swellable fine particles may be preferably 75 μm or less under dry state, further 0.8 to 15 μm, above all 8 μm or less.

In the ink, if necessary, colorants such as dyes or pigments generally employed in the field of printing, recording such as carbon black, etc. can be contained. When a colorant is contained in the ink, the content of the colorant should be preferably 0.1 to 40 parts by weight, further 1 to 20 parts by weight, based on 100 parts by weight of the ink. Also, in place of the colorant, or together with the colorant, a color forming compound which forms color by application of a voltage may be also contained. Otherwise, in the ink can be contained electrolytes for imparting electroconductivity, thickeners, thinners, surfactants, etc. Also, it is also possible that the fine particles as described above should also have the function as the colorant.

For obtaining such ink, for example, a liquid dispersing medium and fine particles may be mixed in conventional manner.

When the ink constituted of the above-described materials is coated on a platinum plated stainless steel plate of 1 cm×1 cm with a thickness of about 2 mm, then a platinum plated stainless steel plate of the same size as above placed on the ink and thereafter the two sheets of the two platinum plated stainless steel plates were separated by expanding the interval between the two sheets of platinum plated stainless steel plates under no voltage, whereby the ink was found to be adhered onto the both platinum plated plates substantially over the whole region.

Next, with one of the platinum plated stainless steel plates with an ink layer with a thickness of 2 mm sandwiched therebetween as the cathode (earth) and the other as the anode, a voltage of +30 V was applied, and the two sheets of the platinum plated stainless plates were separated by expanding gradually the interval between the two sheets of the platinum plated stainless plate while applying this voltage, all the ink was adhered to the electrode on the anode side, while no ink on the cathode side.

Actuation in this embodiment is described by referring to the flow chart in FIG. 7B.

After peeling, the photosensitive member 11 having an image cured by polymerization is hereinafter called "print plate 11b". The print plate 11b is conveyed by convey rolls 42, 43 to the plate cylinder 44 (step S-48), and by rotating the plate cylinder (S-49), closely fixed by the nip portion 45 onto the plate cylinder 44 (S-50). By rotating the ink bearing roller (S-51), the ink 49b is coated uniformly on the roller. Next, the tip end of the form plate is detected (S-52), electric communication begins between the ink bearing roller 67 and the form plate roller (S-53), simultaneously with pressure contact of the ink bearing roller onto the form plate (S-54).

The tip end of the form plate is detected (S-55), the recording convey roller is rorated (S-56), the blanket cylinder is pressure contacted onto the form plate (S-57), whereby the tip end of the recording paper and the tip end of the form plate are synchronized to start printing.

After finish of printing of a predetermined number of sheets (S-58), the recording paper convey roll is stopped and the blanket cylinder is retracted (S-59). Next, the ink bearing roller is retracted (S-60), and electric communication between the ink bearing roller and the form plate roller is ended (S-61). Further, the ink bearing roller motor is stopped (S-62), the tip end of the form plate is detected (S-63), the nip portion is retracted (S-64), and the used form plate is discarded into the discarding stocker (S-65). Subsequently, the form plate roller motor is stopped (S-66).

FIG. 8A is an embodiment in which the process device and the printing device are miniaturized, specificially the process drum and the plate cylinder are made common.

FIG. 8B is a flow chart showing the actuation of this device.

When a switch (not shown) in turned ON, the motor for driving rollers 69a, 69b for conveying print plate is driven (S-70), the print plate 11 is delivered from the print plate cartridge 13. The above print plate 11 is gripped with the clamp 71a on the process drum 70 (S-71), then the process drum driving motor is turned ON to rotate the plate preparing drum in the arrowhead direction in FIG. 8A (S-72). The length (trail end) of the print plate 11 is detected by a sensor (not shown) (S-73), and the roller driving motor for conveying print plate and the process drum driving motor are turned OFF (S-74). Next, after the print plate 11 is cut (S-75 - S-77), again the roller driving motor for conveying print plate and the process drum driving motor are turned ON (S-78). When the print plate trail end is detected by a sensor (not shown) (S-79), the above-mentioned motors are turned OFF (S-80), and the print plate trail end is pressed by the clamp 71b.

Next, simultaneously with driving of the process drum 70, the heat developing portion heater 72 and the whole-surface exposure portion light source 73 lighting are turned ON (S-82, S-83, S-84). When the print plate tip end is detected (S-85), image signals are sent from an external signal source (not shown) to write images by a laser on the print plate (S-86). Also, the bias heating heater 74 within the process drum 70 is turned ON (S-87).

Next, whether recording is finished or not is detected by the end of image signal (S-88), and after passage of the heat developing portion 3 and the whole-surface exposure portion 4 through the print plate trail end by a sensor (not shown) (S-89), all the heaters and light sources are turned OFF (S-90).

Next, simultaneously with speed-up of the driving motor of the process drum 70, the driving motor for ink bearing roller 75 and the driving motor for blanket cylinder 76 are turned ON (S-91). Simultaneously with the above-mentioned actuation, the driving motor for recording paper conveyance is turned ON (S-92), the recording paper tip end is detected by a resist sensor, and the motor for driving recording paper conveying rollers 78a, 78b, 78c, 78d is turned ON.

Next, the brush cylinder 76, the ink bearing roller 75 are mounted on the process drum 70, and the impression cylinder 79 is mounted and actuated (S-95, S-96). The motor for actuating recording paper conveyance is driven (S-97) to start printing. After a predetermined number of sheets are printed by detecting the predetermined number of sheets by a counter (not shown) (S-98), the motor for recording paper conveyance is turned OFF (S-99). The brush drum 76, the ink bearing roller 75 and the pressure drum 79 are retracted from the process drum 70 to finish actuation (S-100), and the motors for driving the brush drum 76, the ink bearing roller 75 and the pressure roller 79 are turned OFF (S-101).

Next, the process drum 70 speed is reduced (S-102), and after detection of the tip end of the printing plate, the process drum 70 is stopped before the form plate discharge rollers 80a, 80b. Next, by operating the rollers for form plate discharge, the form plate is gripped with clamps 71c, 71d. The motor for form plate drum actuation and the motor for form plate discharge roller are turned ON, and the print plate 11 is peeled off from the process drum 70. And, the clamp 71c of the form plate discharge roller is dismantled and discharged into the form plate discharge stocker.

After detection of finish of the form plate discharge, roller motor for form plate discharge is stopped, the roller actuating motor for form plate discharge is turned OFF and the process drum motor is stopped so that the position of the clamp may be stopped at the print plate delivery roller position to finish printing.

Figure 9:
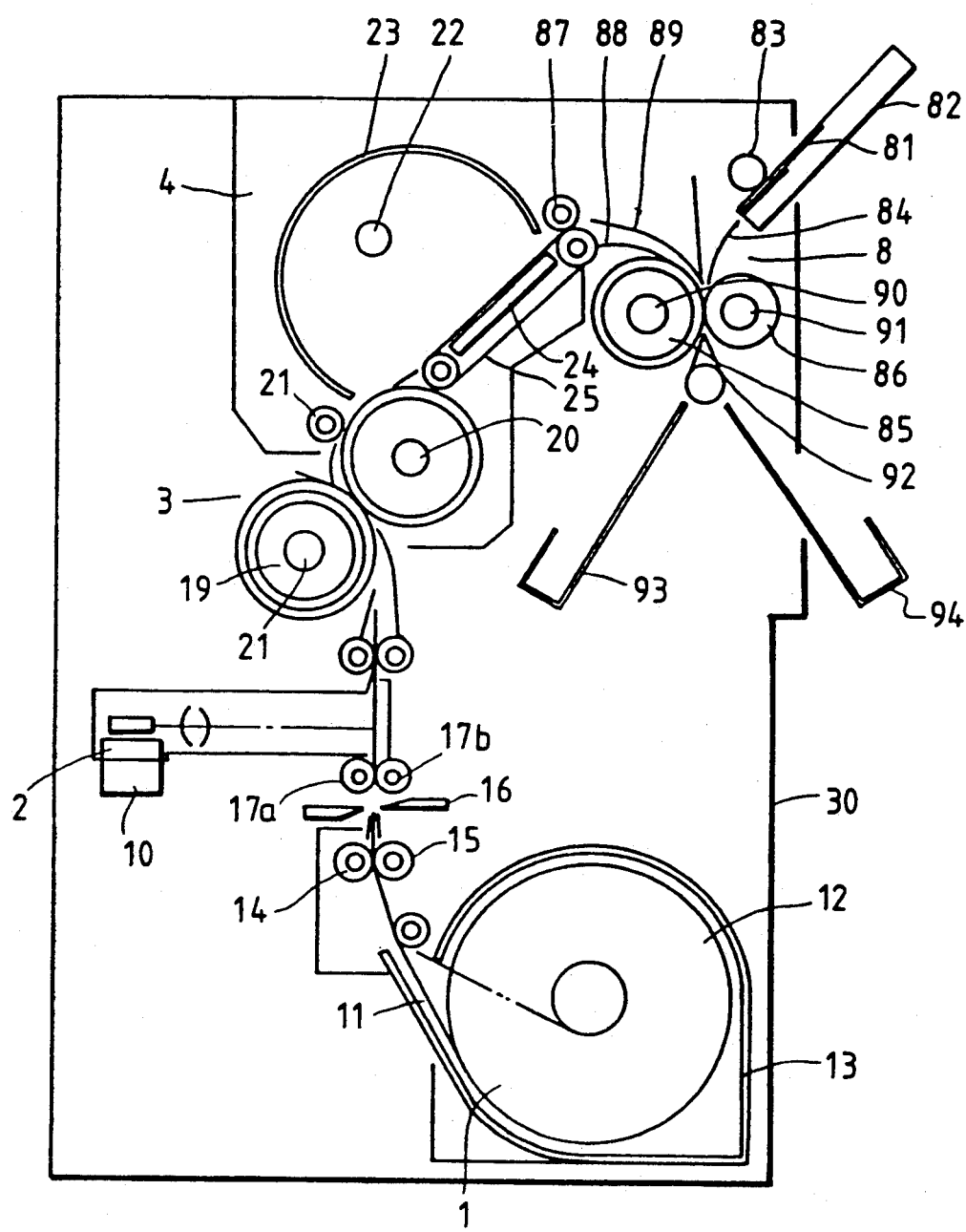
FIG. 9 is a schematic sectional view showing another embodiment of the present invention.
Figure 10:
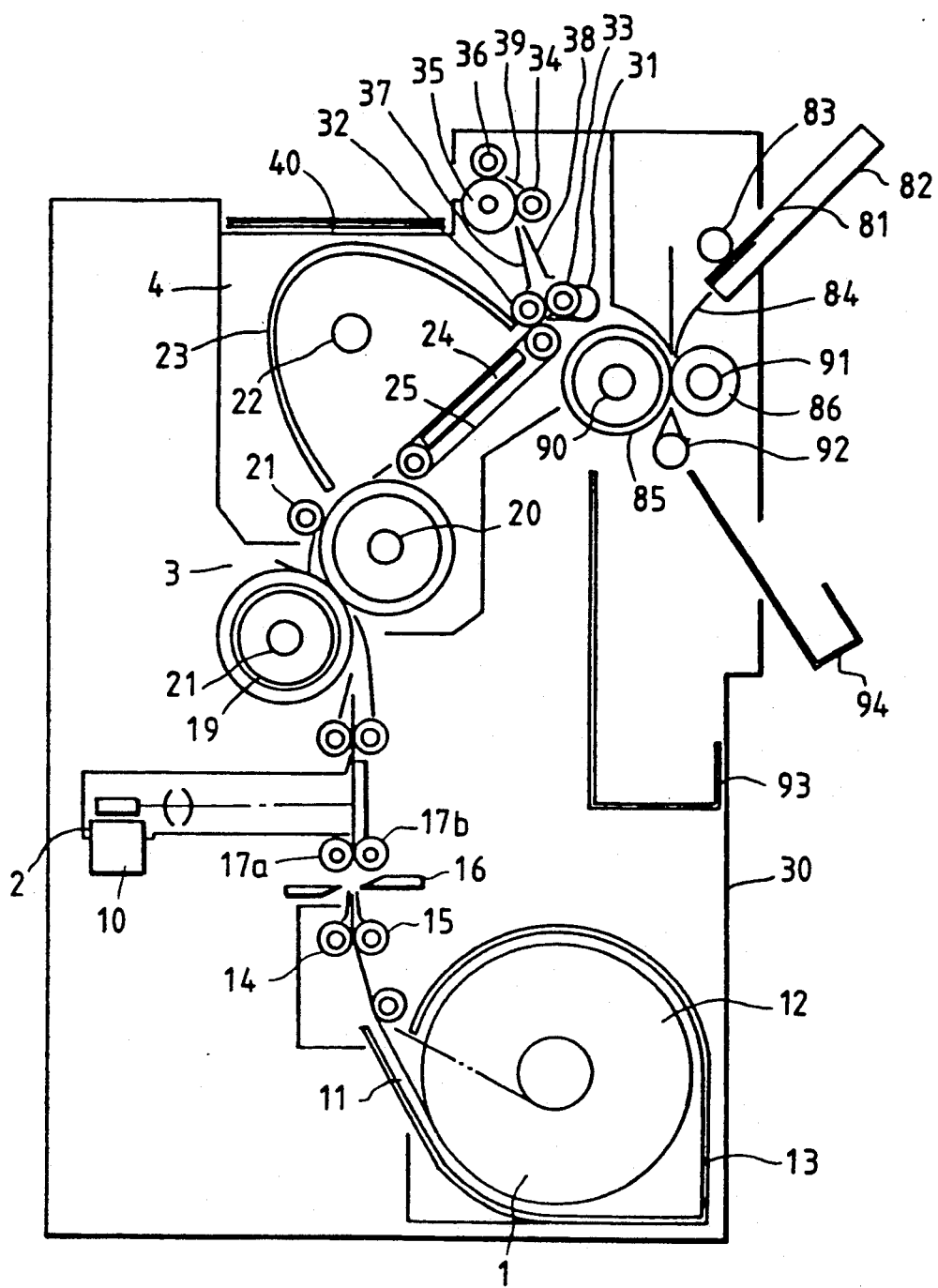
FIG. 10 is a schematic sectional view showing another embodiment of the present invention.

FIG. 9 and FIG. 10 show another color image forming device. The image forming method in this device comprises forming a polymerized image according to the steps as described above on a photosensitive member 11 containing a heat diffusible dye and effecting heating transfer onto an image receiving member 81 provided opposed to the above photosensitive member 11 corresponding to the difference in polymerization degree thereof, thereby forming a color image.

FIG. 9 shows a color image forming device by use of the image forming method in which the photosensitive member 11 and the image receiving member 81 are directly superposed on each other, thereby transferring the heat diffusible dye onto the image-forming member 81.

FIG. 10 is a color image forming device by use of the image forming method in which a protective layer or further a photosensitive layer of the photosensitive member 11 is peeled off before transfer, and then the photosensitive member is superposed on the image receiving member 81 to transfer a heat diffusible dye onto the image receiving member 81. By doing so, the diffusion distance of the heat diffusible dye becomes shorter, whereby there is the specific feature that the image formed on the image receiving member 81 becomes sharp.

Figure 11:
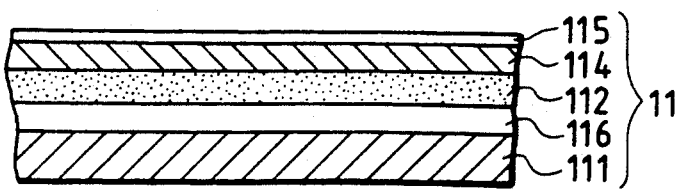
FIG. 11 is another layer constitutional view of the image forming member to be used in the present invention.
Figure 12C:
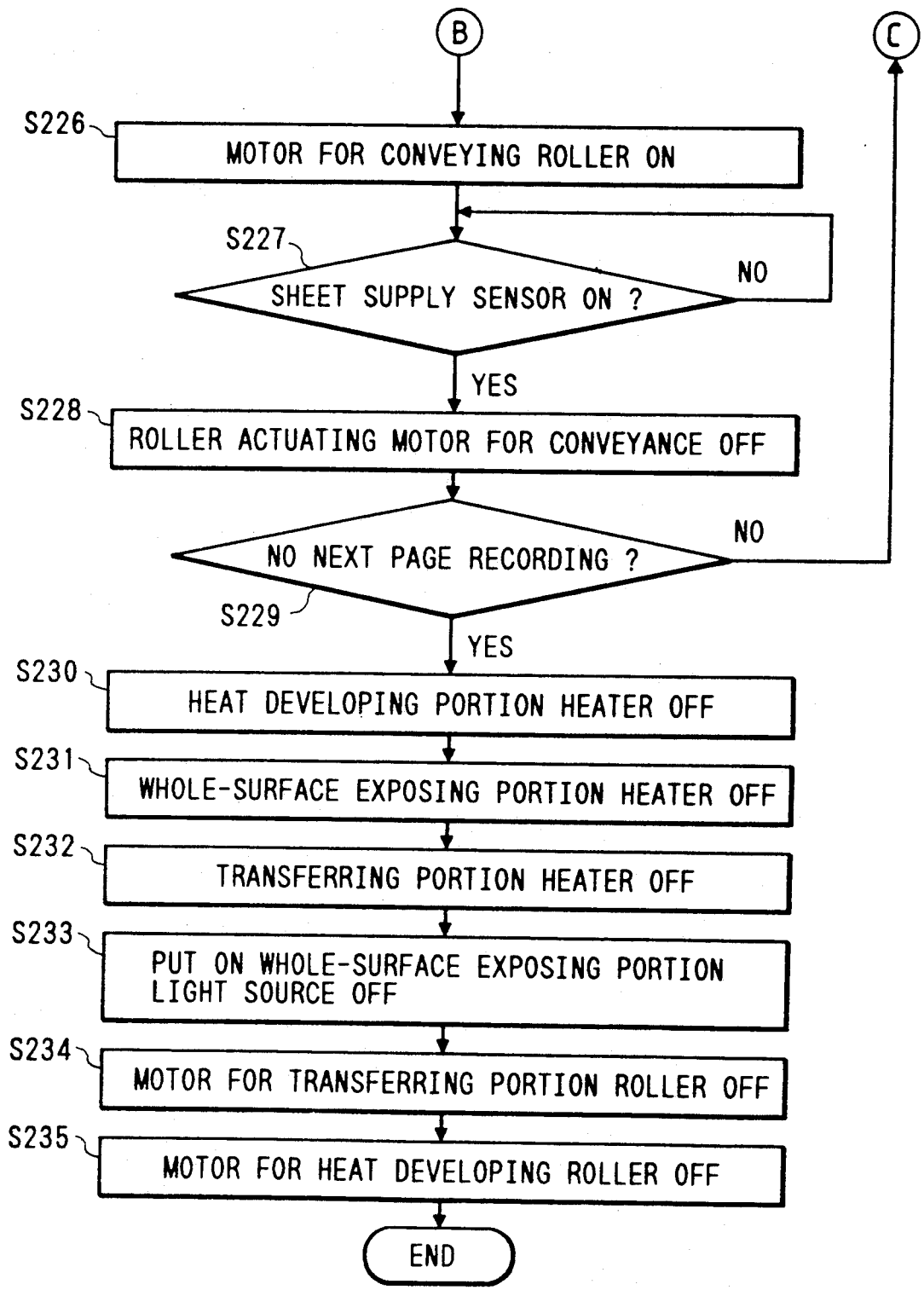

FIG. 11 is a flow chart showing the operations of the present color image forming device, and FIG. 12 is a sectional view of the photosensitive member 11.

Concerning the color image forming device of FIG. 9, description is made in detail. The color image forming device comprises a paper feeding portion 1, an image exposure portion 2, a heat developing portion 3, a whole-surface exposure portion 4, a transfer portion 8 and a paper discharge portion 5. The steps from the paper feeding portion 1 to the whole-surface exposure portion 4 and the step of the paper discharge portion 5 are the same as in the foregoing steps, and hence description is made here about the transfer portion 8.

In FIG. 9, numeral 81 is an image receiving member, which is housed in a freely detachable image receiving cartridge 82. The image receiving member 81 delivered by the delivery roll 83 from the image receiving member cartridge 82 is delivered from the conveying guide 84 to the transfer rollers 85, 86. On the other hand, the photosensitive member 11 is passed through the above steps and is delivered from the whole-surface exposure portion to the transfer rollers 85, 86 by the conveying roller 87 and the conveying guides 88, 89.

The image receiving member 81 and the photosensitive member 11 are delivered to the transfer portion 8 and superposed at a predetermined position. The transfer rollers 85, 86 heat the image receiving member 81 and the photosensitive member 11 superposed as described above with halogen heaters 90, 91 arranged internally of the transfer rollers, thereby diffusing the diffusible dye from the image forming member 11 onto the image receiving member to form a color image. The transfer temperature at this time was 70° to 170° C., preferably 100° C. to 150° C., more preferably 100° to 130° C. The above photosensitive member 11 and the image receiving member 81, after separated by the separation nail 92, are delivered to the discharge trays 93, 94.

FIG. 10 includes the step of peeling off the photosensitive layer or further the protective layer of the photosensitive member 11. In this device, after passing through the whole-surface exposure portion 4, the photosensitive layer or further the protective layer of the photosensitive member 11 is peeled off with a peeling nail 31, and conveyed by the convey rollers 32, 33, 34, 35, 36 and the convey guides 37, 38, 39 to be delivered to the discharge tray 40.

FIG. 11 shows a sectional view of the photosensitive member 11 used in the above-described FIG. 9 and FIG. 10. The photosensitive member 11 consists mainly of a substrate 111, a colorant layer 116, a polymerized layer 112, a photosensitive layer 114 and a protective layer 115 (the protective layer 115 is not essentially required). For the substrate layer 111, the polymerized layer 112, the photosensitive layer 114, the protective layer 115, the same materials as described in the foregoing embodiments are employed. The colorant layer 116 is a layer having a heat diffusible dye formed into a thin layer together with a binder.

The heat diffusible substance to be contained in the colorant layer in the present invention may be either colored or colorless, as exemplified by monoazo dyes, thiazoleazo dyes, anthraquinone dyes, triallylmethane dyes, rhodamine dyes, naphthol dyes, triarylmethane type dyes, fluorane type dyes, phthalide dyes, etc. The heat diffusible substance is generally greater in thermal diffusibility as the molecular weight is smaller, and also thermal diffusibility is smaller as the dye contains more polar groups such as carboxylic group, amino group, hydroxyl group, nitro group, sulfone group, etc. Therefore, a dye having a desired thermal diffusibility may be suitably chosen with the molecular weight and the functional group as a measure depending on the polymerization crosslinking degree, the heating condition, etc. in the photosensitive member of the present invention.

As the developer in the image receiving layer for indicating a color through the reaction with a colorless heat diffusible substance, there can be employed zinc oxide, calcium sulfate, novolac type resin, zinc 3,5-dimethyl-t-butyl-salicylate, etc.

As the suitable binder to be used in the colorant layer, as shown in the foregoing embodiment, it can be chosen from a wide scope of resin.

FIG. 11 is formed of the respective layers separated from each other, but various layer constitutions such as a layer constitution in which the photosensitive layer, the polymerized layer and the colorant layer are formed integrally, etc. are also applicable.

Next, the operations of the present device are described by referring to FIG. 12.

When the main switch (not shown) is turned on, the motors of the respective convey rollers at the heat developing portion, the whole-surface exposure portion and the transfer portion and the heaters of heat sources are actuated to light sources (S201–S202).

Next, the photosensitive member 11 is delivered from the paper feeding portion 1 by the convey rollers 14, 15 (S-207) from the cartridge 13. The resist sensor (not shown) at the cutter portion delivers a signal to the control portion (not shown) so that the tip end of the paper may stop conveyance at the position of the convey roller 17 (S-108, 209). At the control portion which has received the above signal, on receiving of the recording start signal (S-210), conveyance is restarted (S-211) to effect exposure writing onto the photosensitive member 11 (S-212). After finish of writing (S-213), conveyance of the image forming member 11 is stopped (S-114), followed by cutting (S-215). After confirmation of cutting of the photosensitive member 11, the sheet cut driving motor is stopped (S-216, S-217).

Next, again, the convey roller driving motor is turned ON to convey the photosensitive member 11. The photosensitive member 11 is permitted to pass through the heat developing portion and the whole-surface exposure portion 4, and it is detected by a passage sensor (not shown) whether the photosensitive member 11 has passed through the whole-surface exposure portion 4 or not (S219). After detection, the image receiving convey motor is turned ON to deliver an image receiving member from the image receiving cartridge (S220).

Motors for driving the photosensitive member, image receiving member convey rollers are stopped (S221, S222), followed by cutting of the image receiving member (S223–225). Next, the motor for driving convey roller is turned ON (S226) and under the state with the photosensitive member 11 and the image receiving member being superposed, transfer is effected by passing the transfer roller. After transfer, the photosensitive member 11 and the image receiving member are separated and discharged. During that operation, the paper discharge sensor detects the discharged paper (S227).

Next, the motor for driving convey roller is turned off (S228), and judgement is made whether there is next recording or not (S229). If there is no recording, the heat developing portion, the whole-surface exposure section, the heat source of the transfer portion, the roller driving motor and light sources are turned off to finish the cycle (S230–S235).

By use of the above-described device, because a polymer image is formed with light, not only resolution and contrast are improved, but an image can be obtained with a small scale device by dry process treatment with a short time.

According to the present invention as described above, the above-mentioned objects can be accomplished, and by arranging a uniform exposure device above the heat developing portion as in the device shown in the embodiments, the air in the vicinity of the exposure source can be warmed with ease, whereby the wavelength of light can be maintained stably, and further the chemical reaction can be promoted by heat to improve the image formation speed. Further, by positioning of the supply source of the photosensitive member lower than the heating means, the photosensitive member used for image formation by polymerization in the present invention can be protected from heat during non-image formation, whereby denaturation or deterioration of the photosensitive member can be prevented. Further, by positioning the light information irradiation means lower than the heating means, thermal expansion of the optical system by temperature elevation can be made minimum, whereby exposure of optical information of high quality can be effected on the photosensitive member. By combination of two or more of these constitutions, formation of a polymer image of higher quality is rendered possible.

We claim:

1. An image forming device employing dry process silver salt materials comprising:
   (a) a sheet-shaped photosensitive member having a monomer and a photopolymerization initiator on a substrate, a reducing agent, a photosensitive silver halide and an organic silver salt;
   (b) a supply means for said photosensitive member;
   (c) an irradiation means for irradiating light information on said photosensitive member provided by said supply means;
   (d) a heat means for heating said photosensitive member after the irradiation thereof by said irradiation means; and
   (e) a uniform exposure means for exposing uniformly said photosensitive member for forming a polymer image on said photosensitive member after said photosensitive member is heated by said heat means.

2. The image forming device of claim 1 wherein the irradiation means is a laser exposure means.

3. An image forming device employing dry process silver salt materials comprising:
   (a) a sheet-shaped photosensitive member having a monomer and a photopolymerization initiator on a substrate, a reducing agent, a photosensitive silver halide and an organic silver salt;
   (b) a supply means for said photosensitive member;
   (c) an irradiation means for irradiating light information on said photosensitive member provided by said supply means;
   (d) a heating means for heating said photosensitive member after the irradiation thereof by said irradiation means;
   (e) a uniform exposure means for exposing uniformly said photosensitive member for forming a polymer image on said photosensitive member after said photosensitive member is heated by said heating means; and
   (f) a separation means for separating forcibly the portion which has not undergone photopolymerization after passing through the uniform exposure means.

4. An image forming device according to claim 3, wherein said photosensitive member has a multi-layer constitution having a photosensitive layer containing a heat developing type photosensitive composition and a polymerization layer containing a photopolymerizable composition.

5. An image forming device according to claim 3, wherein said photosensitive member has a layer constitution containing a heat developing type photosensitive composition and a photopolymerizable composition in the same layer.

6. An image forming device according to claim 3, wherein said light information irradiation means is positioned lower than the heating means.

7. The image forming device of claim 3 wherein the irradiation means is a laser exposure means.

8. An image forming device employing dry process silver salt materials comprising:
   (a) a sheet-shaped photosensitive member having a monomer and a photopolymerization initiator on a substrate, a reducing agent, a photosensitive silver halide and an organic silver salt;
   (b) a supply means for said photosensitive member;
   (c) an irradiation means for irradiating a light information on said photosensitive member provided by said supply means;
   (d) a heat means for heating said photosensitive member after the irradiation thereof by said irradiation means;
   (e) a uniform exposure means for exposing uniformly said photosensitive member for forming a polymer image on said photosensitive member after said photosensitive member is heated by said heat means;
   (f) a separation means for continuously forcibly separating a non-polymerized portion which has not undergone photopolymerization after passing through the uniform exposure means;
   (g) a photosensitive supporting means which supports the photosensitive member having the polymer image as the non-polymerized portion is continuously peeled off;
   (h) an ink material coating means for coating an ink material on the photosensitive member supported by the photosensitive supporting means; and
   (i) a transfer means for transferring the ink material image of the photosensitive member to a recording material.

9. An image forming device according to claim 8, wherein (i) an electroconductive member is the substrate of said photosensitive member, and (ii) the ink material, when placed between electrodes, differs in its state attached to both electrodes depending on the direction of the current passing through the ink material, and the ink material is supplied to the polymerized portion of the photosensitive member by coating the ink material while applying a bias voltage thereon in the ink material coating means.

10. The image forming device of claim 8 wherein the irradiation means is a laser exposure means.

11. An image forming device employing dry process silver salt materials comprising:
   (a) a sheet-shaped photosensitive member having a monomer and a photopolymerization initiator on a substrate, a reducing agent, a photosensitive silver halide and an organic silver salt;
   (b) a supply means for said photosensitive member;

(c) an irradiation means for irradiating light information on said photosensitive member provided by said supply means;

(d) a first heat means for heating said photosensitive member after the irradiation thereof by said irradiation means;

(e) a uniform exposure means for exposing uniformly said photosensitive member for forming a polymer image on said photosensitive member after said photosensitive member is heated by said first heat means;

(f) a separation means for separating forcibly the portion which has not undergone photopolymerization after passing through the uniform exposure means;

(g) a supply means for supplying a sheet-shaped image receiving member to the photosensitive member peeled off;

(h) a second heat means for heating the superposed photosensitive member and image-receiving member; and (i) a separation means for separating the photosensitive member from the image-receiving member having dyes transferred thereon.

12. An image forming device according to claim 11, wherein said light information irradiation means is positioned lower than the heating means.

13. The image forming device of claim 11 wherein the irradiation means is a laser exposure means.

14. An image forming device employing dry process silver salt materials comprising:

(a) a sheet-shaped photosensitive member having a monomer and a photopolymerization initiator on a substrate, a reducing agent, a photosensitive silver halide and an organic silver salt;

(b) a supply means for said photosensitive member;

(c) an irradiation means for irradiating light information on said photosensitive member provided by said supply means;

(d) a heat means for heating said photosensitive member after the irradiation thereof by said irradiation means; and (e) a uniform exposure means positioned above the heating means for exposing uniformly said photosensitive member for forming a polymer image on said photosensitive member after said photosensitive member is heated by said heat means.

15. An image forming device according to claim 14, wherein the supply source of said photosensitive member is positioned lower than the heating means.

16. An image forming device employing dry process silver salt materials comprising:

(a) a sheet-shaped photosensitive member having a monomer and a photopolymerization initiator on a substrate, a reducing agent, a photosensitive silver halide and an organic silver salt;

(b) a supply means for said photosensitive member;

(c) an irradiation means for irradiating light information on said photosensitive member provided by said supply means;

(d) a heat means positioned above the irradiation means for heating said photosensitive member after the irradiation thereof by said irradiation means; and (e) a uniform exposure means for exposing uniformly said photosensitive member for forming a polymer image on said photosensitive member after said photosensitive member is heated by said heat means.

17. An image forming device employing dry process silver salt materials comprising:

(a) a sheet-shaped photosensitive member having a monomer and a photopolymerization initiator on a substrate, a reducing agent, a photosensitive silver halide and an organic silver salt;

(b) a supply means for said photosensitive member;

(c) an irradiation means for irradiating light information on said photosensitive member provided by said supply means;

(d) a heating means for heating said photosensitive member after the irradiation thereof by said irradiation means;

(e) a uniform exposure means positioned above the heating means for exposing uniformly said photosensitive member for forming a polymer image on said photosensitive member after said photosensitive member is heated by said heating means; and (f) a separation means for separating forcibly the portion which has not undergone photopolymerization after passing through the uniform exposure means.

18. An image forming device according to claim 17, wherein the supply source of said photosensitive means is positioned lower than the heating means.

19. An image forming device employing dry process silver salt materials comprising:

(a) a sheet-shaped photosensitive member having a monomer and a photopolymerization initiator on a substrate, a reducing agent, a photosensitive silver halide and an organic silver salt;

(b) a supply means for said photosensitive member;

(c) an irradiation means for irradiating light information on said photosensitive member provided by said supply means;

(d) a heat means for heating said photosensitive member after the irradiation thereof by said irradiation means;

(e) a uniform exposure means for exposing uniformly said photosensitive member for forming a polymer image on said photosensitive member after said photosensitive member is heated by said heat means;

(f) a separation means for continuously separating forcibly a non-polymerized portion which has not undergone photopolymerization after passing through the uniform exposure means;

(g) an endless photosensitive supporting means which supports the photosensitive member having the polymer image as the non-polymerized portion is continuously peeled off.

(h) an ink material coating means for coating an ink material on the photosensitive member supported by the photosensitive supporting means;

(i) a transfer means for transferring the ink material image of the photosensitive member to a recording material; and (j) wherein the supply means, irradiation means, heat means, uniform exposure means, separation means, ink material coating means and transfer means are arranged around said endless photosensitive member supporting means.

20. An image forming device employing dry process silver salt materials comprising:

(a) a sheet-shaped photosensitive member having a monomer and a photopolymerization initiator on a substrate, a reducing agent, a photosensitive silver halide and an organic silver salt;

(b) a supply means for said photosensitive member;

(c) an irradiation means for irradiating light information on said photosensitive member provided by said supply means;

(d) a first heat means for heating said photosensitive member after the irradiation thereof by said irradiation means;

(e) a uniform exposure means positioned above the first heat means for exposing uniformly said photosensitive member for forming a polymer image on said photosensitive member after said photosensitive member is heated by said first heat means;

(f) a separation means for separating forcibly the portion which has not undergone photopolymerization after passing through the uniform exposure means;

(g) a supply means for supplying a sheet-shaped image receiving member to the photosensitive member peeled off;

(h) a second heat means for heating the superposed photosensitive member and image-receiving member; and (i) a separation means for separating the photosensitive member from the image-receiving member having dyes transferred thereon.

21. An image forming device according to claim 20, wherein the supply source of said photosensitive member is positioned lower than the heating means.

* * * * *

UNITED STATES PATENT AND TRADEMARK OFFICE
CERTIFICATE OF CORRECTION

PATENT NO. : 5,073,791
DATED : December 17, 1991
INVENTOR(S) : AKIHIRO MOURI, ET AL.

It is certified that error appears in the above-identified patent and that said Letters Patent is hereby corrected as shown below:

ON THE TITLE PAGE
IN [56] REFERENCES CITED

FOREIGN PATENT DOCUMENTS, "58-115638  7/1980"
       should read --58-115638  7/1983--.

IN [57] ABSTRACT

Line 11, "member," should read --member;--.

SHEET 3 OF 22

Figure 3B:
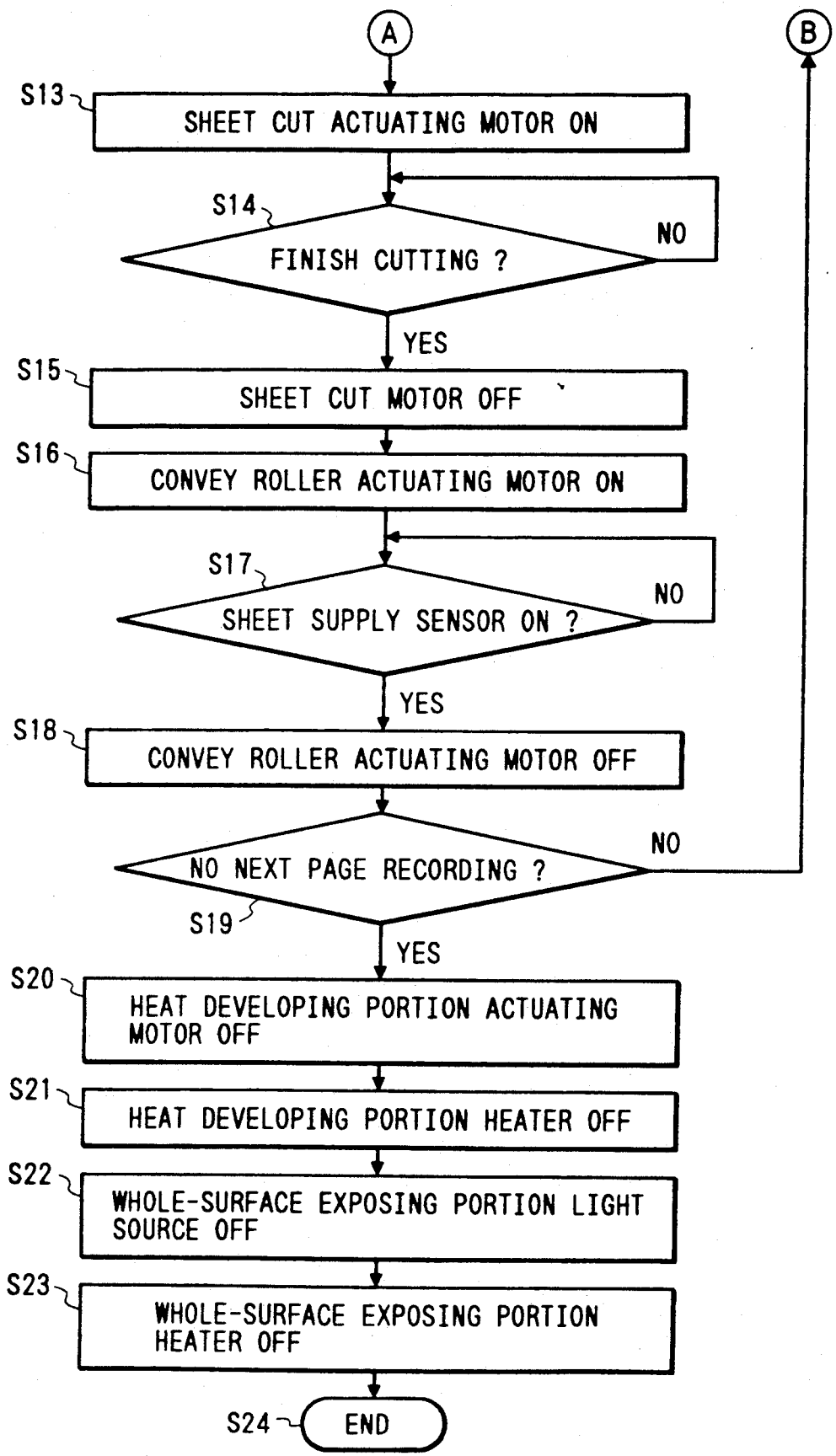

FIG. 3A, "REGIST" should read --RESIST--.

SHEET 8 OF 22

FIG. 5B-2, "BEAING" should read --BEARING--.

COLUMN 1

Line 5, "Filed" should read --Field--.
   Line 16, "such" should be deleted.
   Line 22, "photoesist," should read --photoresist,--.
   Line 40, "formed, disappeared or decomposed and endowed"
        should read --are formed, disappear or are
        decomposed and are endowed--.

COLUMN 2

Line 5, "and a" should read --an--.
   Line 8, "a" should be deleted.
   Line 10, "an" should read --a--.
   Line 23, "FIG. 3 3A, 3B" should read --Fig. 3, including
        Figs. 3A and 3B,--.

UNITED STATES PATENT AND TRADEMARK OFFICE
CERTIFICATE OF CORRECTION

PATENT NO. : 5,073,791
DATED : December 17, 1991
INVENTOR(S) : AKIHIRO MOURI, ET AL.

It is certified that error appears in the above-identified patent and that said Letters Patent is hereby corrected as shown below:

COLUMN 2

Line 29, "5B 5B-1, 5B-2" should read --5B, including Figs. 5B-1 and 5B-2,--.
Line 36, "7B, 7B-1, 7B-2" should read --7B, including Figs. 7B-1 and 7B-2,--.
Line 40, "8B, 8B-1, 8B-2, 8B-3, 8B-4" should read --8B, including Figs. 8B-1 to 8B-4,--.
Line 49, "Fig. 12, 12A, 12B, 12C" should read --Fig. 12, including Figs. 12A to 12C,--.

COLUMN 3

Line 47, "microwave," should read --microwave, and--.

COLUMN 5

Line 27, "m-aminophenol," should read --m-aminophenols,--.
Line 34, "cay" should read --can--.

COLUMN 6

Line 11, "example" should read --examples--.

COLUMN 7

Line 58, "by" should be deleted.
Line 60, "by" should be deleted.

UNITED STATES PATENT AND TRADEMARK OFFICE
CERTIFICATE OF CORRECTION

PATENT NO. : 5,073,791
DATED      : December 17, 1991
INVENTOR(S): AKIHIRO MOURI, ET AL.

It is certified that error appears in the above-identified patent and that said Letters Patent is hereby corrected as shown below:

COLUMN 8

Line 52, "used" should read --made--.

COLUMN 9

Line 35, "about" should be deleted.
Line 40, "at" should be deleted.

COLUMN 10

Line 17, "numerals" should read --numeral--.
Line 23, "Numerals" should read --Numeral--.
Line 27, "Numerals" should read --Numeral--.
Line 30, "image" should read --an image--.
Line 36, "upto" should read --up to-- and
         "step 6" should read --step--.

COLUMN 11

Line 5, "step 6" should read --step--.
Line 24, "pattern 4b" should read --pattern--.
Line 45, "becomes" should be deleted.
Line 68, "applied" should read --is applied--.

COLUMN 12

Line 18, "changed" should read --changes--.
Line 28, "so as to" should be deleted.

UNITED STATES PATENT AND TRADEMARK OFFICE
CERTIFICATE OF CORRECTION

PATENT NO. : 5,073,791

DATED : December 17, 1991

INVENTOR(S) : AKIHIRO MOURI, ET AL.

Page 4 of 5

It is certified that error appears in the above-identified patent and that said Letters Patent is hereby corrected as shown below:

COLUMN 13

Line 17, "ehtylene" should read --ethylene--.

COLUMN 14

Line 18, "Y" should read --Y represent--.
Line 20, "Z" should read --Z represents--.
Line 22, "(Al3+/Si4+)," should read --($Al^{3+}/Si^{4+}$),--.
Line 43, "When" should read --Then--.
Line 46, "then" should be deleted.
Line 61, "voltage, all" should read --voltage. All--.
Line 62, "while" should read --with--.

COLUMN 15

Line 11, "rorated" should read --rotated-- and "the" should read --and the--.
Line 44, (S-75 - S-77)," should read --(S-75 to S-77),--.
Line 68, "blanket" should read --brush--

COLUMN 16

Line 51, "image-forming" should read --image receiving--.

UNITED STATES PATENT AND TRADEMARK OFFICE
CERTIFICATE OF CORRECTION

PATENT NO. : 5,073,791

DATED : December 17, 1991

INVENTOR(S) : AKIHIRO MOURI, ET AL.

It is certified that error appears in the above-identified patent and that said Letters Patent is hereby corrected as shown below:

COLUMN 17

Line 31, "after" should read --after being--.
Line 50, "the" (second occurrence) should read --and the--.

Signed and Sealed this

Eighth Day of June, 1993

Attest:

MICHAEL K. KIRK

Attesting Officer

Acting Commissioner of Patents and Trademarks